United States Patent
Kamijo et al.

(10) Patent No.: US 6,815,693 B2
(45) Date of Patent: Nov. 9, 2004

(54) CHARGED-PARTICLE-BEAM MICROLITHOGRAPHY APPARATUS AND METHODS INCLUDING PROXIMITY-EFFECT CORRECTION

(75) Inventors: Koichi Kamijo, Kawasaki (JP); Kazuya Okamoto, Yokohama (JP); Teruaki Okino, Kamakura (JP)

(73) Assignee: Nikon Corporation, Tokyo (JP)

( * ) Notice: Subject to any disclaimer, the term of this patent is extended or adjusted under 35 U.S.C. 154(b) by 436 days.

(21) Appl. No.: 09/789,402

(22) Filed: Feb. 20, 2001

(65) Prior Publication Data

US 2002/0005494 A1 Jan. 17, 2002

(30) Foreign Application Priority Data

Feb. 18, 2000 (JP) .................................. 2000-041520
Feb. 25, 2000 (JP) .................................. 2000-049136
Mar. 23, 2000 (JP) .................................. 2000-082635

(51) Int. Cl.$^7$ .................... G01J 1/00; G01N 21/00; G01N 23/00
(52) U.S. Cl. ................... 250/491.1; 250/492.2; 250/492.22; 250/492.3; 250/396 ML; 250/396 R; 250/398
(58) Field of Search ............. 250/396 ML, 396 R, 250/398, 492.2–3, 491.1

(56) References Cited

U.S. PATENT DOCUMENTS

| | | | | |
|---|---|---|---|---|
| 5,147,823 A | * | 9/1992 | Ishibashi et al. | ............. 438/694 |
| 5,770,863 A | * | 6/1998 | Nakasuji | ............. 250/492.2 |
| 6,069,684 A | * | 5/2000 | Golladay et al. | ............. 355/53 |
| 6,274,876 B1 | * | 8/2001 | Kawanami et al. | ............. 250/492.22 |
| 6,507,027 B1 | * | 1/2003 | Kojima et al. | ............. 250/396 R |
| 6,528,806 B1 | * | 3/2003 | Kawamura | ............. 250/492.22 |
| 6,556,702 B1 | * | 4/2003 | Rishton et al. | ............. 382/144 |
| 6,610,989 B1 | * | 8/2003 | Takahashi | ............. 250/492.3 |
| 6,630,681 B1 | * | 10/2003 | Kojima | ............. 250/492.22 |
| 6,635,881 B2 | * | 10/2003 | Yamada et al. | ............. 250/396 ML |
| 2002/0005494 A1 | * | 1/2002 | Kamijo et al. | ............. 250/491.1 |
| 2002/0116697 A1 | * | 8/2002 | Okamoto et al. | ............. 716/21 |
| 2003/0017401 A1 | * | 1/2003 | Kawata et al. | ............. 430/5 |
| 2003/0085365 A1 | * | 5/2003 | Yahiro | ............. 250/492.2 |
| 2003/0152850 A1 | * | 8/2003 | Kamijo | ............. 430/30 |

OTHER PUBLICATIONS

Tsudaka et al., "Simulation–Based Automatic Optical Proximity Effect Correction Adaptive for Device Fabrication," Jp. J. Appl. Phys., 36:7477–7481, 1997.

* cited by examiner

Primary Examiner—John R. Lee
Assistant Examiner—Bernard E. Souw
(74) Attorney, Agent, or Firm—Klarquist Sparkman, LLP

(57) ABSTRACT

Methods are disclosed for correcting proximity effects as affected by varying magnitudes of beam blur occurring at different respective locations in an image of a reticle subfield as projected onto the sensitive surface of a substrate. Local resizings of pattern-element profiles as defined on the reticle are made taking into consideration not only proximity effects arising from Coulomb interactions but also different magnitudes of beam blur occurring at different respective locations in a projected subfield. Beam blur is imparted by the projection-optical system and is a function of the magnitude of beam deflection, the location of pattern element(s) within the area of the exposed subfield, and the exposure-energy profile on the surface of the substrate being exposed. A resist-development energy threshold is established such that the edges of pattern elements as transferred to the wafer in response to the exposure-energy profile will be at their desired locations according to design specifications. The corresponding elements as defined on the reticle are adjusted accordingly so that their linewidths as projected will be within design specifications.

25 Claims, 18 Drawing Sheets

CHARGED-PARTICLE-BEAM MICROLITHOGRAPHY APPARATUS AND METHODS INCLUDING PROXIMITY-EFFECT CORRECTION

FIELD OF THE INVENTION

The present invention pertains to microlithography (imaging of a pattern, defined by a reticle or mask, onto a sensitive substrate). Microlithography is a key technique in the manufacture of microelectronic devices such as semiconductor integrated circuits, displays, and the like. More specifically, the invention pertains to microlithography performed using a charged particle beam (e.g., electron beam or ion beam) as an energy beam. Even more specifically, the invention pertains to devices and methods for correcting proximity effects in charged-particle-beam (CPB) microlithography.

BACKGROUND OF THE INVENTION

The most common conventional microlithography technology used for fabricating integrated circuits is the so-called "optical stepper" employing ultraviolet light as an energy beam. Microlithography technology employing a charged particle beam is still limited, in a practical (and hence commercial) sense, to CPB "writing" systems mainly used for producing reticles used as pattern masters in optical steppers. However, in view of the resolution limits of optical microlithography, CPB microlithography has received considerable attention as a possible successor technology to optical microlithography for reasons similar to the argument that electron microscopy achieves greater resolution than optical microscopy.

One reason for the delay in establishing CPB microlithography as a principal lithographic technology used for mass-production of patterned wafers is the low throughput currently obtainable with this technology. One group of techniques currently used for performing CPB microlithography includes the "partial-pattern block exposure" techniques (e.g., cell projection, character projection, and block exposure). Partial-pattern block exposure is used mainly for transferring a pattern including an array containing a large number (typically thousands) of repeated individual pattern units, such as the memory cells on a memory chip. The repeated units normally are very small, typically about 5 $\mu$m square on the substrate. To form the array, the repeated units are exposed over and over again within a region on the wafer corresponding to the chip. As readily understood, considerable time is required to expose the array in each chip, which results in low throughput. Also, this technique is not used to transfer non-repeated portions of the chip pattern. Instead, the non-repeated portions usually are exposed by direct writing using a variable-shaped beam. This need to exploit multiple different techniques to expose each chip further compromises throughput. As a result, the partial-pattern block exposure techniques currently do not provide the throughput required for mass-production wafer fabrication.

A technique offering prospects of substantially greater throughput than the partial-pattern block exposure techniques involves exposing, in a single "shot," a reticle defining the entire pattern to be transferred to a chip or defining a pattern for multiple chips. The reticle is exposed with "demagnification," by which is meant that the reticle image as formed on the wafer is smaller (usually by an integer factor termed a "demagnification ratio") than the corresponding pattern as defined on the reticle. Whereas the throughput potentially achievable using this technique is at least as good as currently achievable using optical microlithography, this technique unfortunately has several serious problems. One problem is the current impossibility of fabricating a reticle configured to be exposed in a single shot of a charged particle beam. Another problem is the current impossibility of adequately correcting off-axis aberrations, especially in peripheral regions of the large image produced by the charged particle beam.

A more recently considered approach is termed "divided-reticle" pattern transfer, which involves dividing the pattern, as defined on the reticle, into multiple individual exposure units usually termed "subfields." Each subfield is exposed individually onto a respective region on the wafer. The subfield images are transferred to the wafer so that, after exposing all the subfields, the subfield images are "stitched" together in a contiguous manner to form the entire chip pattern. As each subfield is exposed, corrections are made to achieve proper focus and reduction of aberrations (e.g., distortion) for the particular subfield. Divided-reticle pattern transfer allows exposures to be made over an optically wide field with much better resolution and accuracy than could be obtained by exposing the entire reticle in one shot. Although divided-reticle pattern transfer does not yet achieve the same throughput as optical microlithography, the throughput nevertheless is much better than obtainable using the partial-pattern block exposure technique.

Certain aspects of divided-reticle pattern transfer are shown in FIGS. 23 and 24. FIG. 23 depicts a wafer on which multiple chips have been exposed. As exposed, each chip comprises multiple "stripes," and each stripe comprises multiple subfields arranged in rows. This same divided arrangement of stripes and subfields is used to define the pattern on the reticle. FIG. 24 depicts an actual exposure. For exposure, the reticle and wafer are mounted on respective stages (not shown but well understood in the art) configured to move the reticle and wafer horizontally (in the figure) as required for exposure. During exposure of a stripe (a portion of which is shown), the reticle stage and wafer stage both move along the longitudinal center line of the respective stripes. Movements of the reticle and wafer are at constant respective velocities (but in opposite directions) in accordance with the demagnification ratio. Meanwhile, the charged particle beam incident on the reticle (the beam upstream of the reticle is termed the "illumination beam" and passes through an "illumination-optical system" to the reticle) illuminates the subfields on the reticle row-by-row and subfield-by-subfield within each row (the rows extend perpendicularly to the movement directions of the reticle and wafer). As each subfield is illuminated in this manner, the portion of the illumination beam passing through the respective subfield (now termed the "patterned beam" or "imaging beam") passes through a projection-optical system to the wafer.

During exposure of a stripe, to expose the rows and subfields within each row of the stripe in a sequential manner, the illumination beam is deflected at right angles to the movement direction of the reticle stage and the patterned beam is deflected at right angles to the movement direction of the wafer stage. After completing exposure of each row, the illumination beam is deflected in the opposite direction, as shown in FIG. 24, to expose the subfields in the next row of the stripe. This exposure technique reduces extraneous deflections of the beam and improves throughput.

Whenever a "sensitive substrate" (e.g., resist-coated wafer) is irradiated with a charged particle beam, backscattering of charged particles from the resist and substrate causes the actual exposure dose to vary according to the distribution of pattern elements in the proximity of the beam. This phenomenon commonly is known as a "proximity effect." The proximity effect also arises from forward-scattering of incident charged particles into the resist. Forward-scattering and backscattering results in a net outward propagation (spreading propagation) of charged particles from the respective points of incidence through the resist. This spreading out of charged particles from the respective points of incidence applies exposure energy to areas of the resist (adjacent to points of incidence) where exposure is not desired. Current methods for solving this problem include adjusting the radiation dose to obtain the desired amount of accumulated energy on the substrate, as described in Japan Kôkai Patent Document No. Hei 11-31658, and modifying the profiles of individual pattern elements as defined on the reticle ("local resizing") so as to achieve desired "as-projected" profiles of the elements on the substrate, as described in *Jpn. J. Appl. Phys.* 36:7477–7481, 1997.

Another problem is beam "blur" introduced by the CPB optical system of the microlithography apparatus. Blur is caused by geometric aberrations (e.g., spherical aberrations) similar to those encountered in conventional light-optical systems, and by Coulomb interactions (mutual repulsion) between individual particles in the propagating beam.

Geometric aberrations worsen with increased lateral distance from the optical axis. (The optical axis is the axis of the lens column of the illumination-optical system and projection-optical system.) In divided-reticle projection-transfer systems, in which the reticle subfields are exposed individually, blur increases with the increased lateral distance between the optical axis and the center of the subfield or other individual exposure unit being exposed. Within individual subfields, blur generally tends to be greater at the edges of the subfield than at the center of the subfield.

Blur due to Coulomb interactions tends to become more pronounced with increases in the surface area of individual exposed pattern elements, because larger pattern elements receive more beam current than smaller pattern elements. This blur results in unwanted variations in pattern linewidth as projected onto the substrate. More specifically, blur reduces the number of charged particles entering the intended incidence locus on the surface of the sensitive substrate. The effect of blur is similar to a proximity effect; namely, for example, the pattern-element lines are wider or narrower than intended.

Conventionally, measures for reducing blur are limited to applying deflection-magnitude corrections (i.e., correcting the lateral distance between the optical axis and the center of the exposed subfield) and correcting focus according to the net area of pattern elements, relative to total subfield area, in the particular subfield being exposed. Because the entire subfield is exposed simultaneously in the respective shot, in a subfield in which blur exhibits a large variation between the center and peripheral edges of the subfield, these conventional remedies cannot simultaneously correct for variations in blur. Consequently, due to uncorrected blur, some of the subfields inevitably have unwanted variations in the sizes of their respective pattern elements as projected onto the substrate.

Conventionally, whenever some of the projected subfields have a large degree of blur and others have only a small degree of blur, blur is increased intentionally in the latter subfields using a focus-correction lens. As a result, all the subfields as projected have roughly the same degree of blur and the same scatter coefficient based on proximity effects over the entire chip. The blur is corrected by altering the respective profiles of individual pattern elements on the reticle ("local resizing").

The conventional methods for reducing blur and proximity effects as summarized above achieve compensation of different degrees of blur and proximity effects between individual subfields. However, whenever the degree of blur at the center of a particular subfield is different from the degree of blur at the edge of the same subfield, because the edge and center are both exposed at the same instant, the conventional method summarized above is ineffective for correcting this difference. As a result, in some subfields, unintended variations in the sizes of individual pattern elements occur due to blur.

Also, in the conventional situation summarized above, even if the microlithography apparatus that is used produces some exposed subfields having low degrees of blur, any possibility of using those low-blur subfields to produce fine patterns on the substrate is elusive because of the blur intentionally imparted during exposure.

SUMMARY OF THE INVENTION

In view of the shortcomings of conventional apparatus and methods as summarized above, an object of the invention is to provide proximity-effect correction methods allowing projection of patterns with higher dimensional accuracy than obtainable conventionally.

According to a first aspect of the invention, methods are provided (in the context of a charged-particle-beam CPB microlithography method) for correcting proximity effects resulting from backscattering of charged particles in the resist-coated substrate. In one embodiment, the proximity effects are corrected by correcting pattern-exposure data including data on radiation dose and respective profiles and dimensions of pattern elements, so as to adjust respective positions of edges of the pattern elements as defined on the reticle. In this embodiment, data concerning blur of the charged particle beam irradiating the substrate is determined for selected subfields. The blur for a selected subfield is a function of beam deflection to expose the subfield and of location of one or more pattern elements within the subfield. From the determined blur, preliminarily corrected pattern-element exposure data are calculated. At one or more edges of a pattern element as exposed onto the substrate, exposure dose, as affected by backscattering, of the pattern element (as defined by the preliminarily corrected pattern-exposure data) is calculated. From the determined blur and calculated exposure dose, a distribution of exposure dose in the vicinity of pattern-element edges as projected onto the substrate is calculated. From the calculated distribution of exposure dose, a dose threshold value is determined. From the determined dose threshold value and the calculated distribution of exposure energy, positions of pattern-element edges (that actually will be formed on the substrate) are predicted. From the predicted positions of pattern-element edges, the pattern-element edge positions as defined on the reticle are adjusted to cause the pattern-element edges as projected to be situated in respective prescribed locations on the substrate.

Calculation of exposure dose as affected by backscatter can be performed in a manner in which, in a pattern region having a dimension substantially similar to a diameter of backscatter from an edge of the pattern element, a grid is defined for dividing the pattern region into sub-regions containing respective portions of the pattern element. For example, the sub-regions have dimensions that are from $\frac{1}{100}$ to ⅓ the backscatter diameter. Within a sub-region, the respective pattern-element portion is defined by a corresponding representative figure. The exposure dose, as affected by backscattering, is calculated based on the representative figure.

Determining blur can include determining a difference of blur from another location on the pattern from maximal blur for the pattern. In this instance, the correction is made, from doses contributed by proximity effects and slopes of edges of projected pattern elements, such that, at a prescribed dose threshold, the edges of the pattern elements are projected at their respective prescribed locations on the substrate.

According to another embodiment of a method for correcting proximity effects at time of reticle fabrication, beam blur (of the charged particle beam irradiating the substrate) is determined as a function of beam deflection and respective locations of pattern elements within an area of the pattern exposed in a respective shot. At one or more edges of a pattern element as exposed onto the substrate, exposure dose (as affected by backscattering) of the pattern element is determined. From the determined blur and the calculated exposure dose, a distribution of exposure dose in the vicinity of pattern-element edges as projected onto the substrate is calculated. From the calculated distribution of exposure dose, a dose threshold value is determined. From the determined dose threshold value and the calculated exposure dose, positions of pattern-element edges that actually will be formed on the substrate are predicted. From the predicted positions of pattern-element edges, the pattern-element edge locations to be defined on the reticle are adjusted to cause the pattern-element edges as projected to be situated in respective prescribed locations on the substrate.

In yet another embodiment of a method, according to the invention, for correcting a proximity effect, a design pattern is defined that is to be formed on the resist-coated substrate. A primary reticle pattern is obtained by enlarging the design pattern by the reciprocal of a demagnification ratio of the projection-exposure system. An energy profile DW(x) of the charged particle beam is calculated that would exist at the resist-coated substrate after passage through the primary reticle pattern and through the projection-optical system. The calculation of DW(x) takes into account a reduction of energy at the substrate due to blur of the charged particle beam during passage through the projection-optical system. A profile E(x) of cumulative exposure energy, due to backscatter occurring at the resist-coasted substrate being irradiated by a charged particle beam having the energy profile DW(x), is calculated. For an energy profile that is a sum of DW(x) and E(x), a development-energy threshold is set for the pattern elements as projected from the primary reticle pattern. Widths of pattern elements, that would be formed on the resist-coated substrate exposed with the charged particle beam from the primary reticle pattern, are calculated. From the calculated widths of pattern elements, the primary reticle pattern is corrected to form a for-projection pattern that will produce linewidths according to the design pattern. To such end, corrections are made to individual pattern elements as defined on the reticle, taking into account the beam blur versus location of edges of the respective pattern elements within an area to be exposed in a single shot.

According to another aspect of the invention, methods are provided (in the context of CPB microlithography) for producing a reticle defining pattern elements configured so as to correct proximity effects in the pattern as projected onto the resist-coated surface of the substrate. In an embodiment of such a method, data are produced for a primary reticle pattern as defined on a segmented reticle comprising subfields each defining a respective portion of the reticle pattern to be exposed onto the substrate in a respective shot. For each subfield, and according to the primary-reticle-pattern data, a distribution of blur at the substrate is determined that would exist if the pattern, as defined by the primary reticle pattern, were projected onto the substrate. From the determined distribution of blur from the primary reticle pattern, a distribution of beam energy that would exist at the substrate for each projected subfield is determined. From the determined distribution of beam energy as projected on the substrate for each subfield, a distribution of exposure energy in the resist-coated substrate for each subfield is determined, taking into account proximity effects and backscattering of the beam in the resist-coated substrate. From the determined distribution of exposure energy, a dose threshold for each subfield is determined. From the determined distribution of exposure energy and dose threshold, data defining locations of edges of pattern elements in the respective pattern portion defined by each subfield are generated. Hence, when the respective pattern portions are projected, the pattern elements will form at desired respective locations with desired profiles on the resist-coated substrate. Finally, from the generated data, the reticle is fabricated.

In another embodiment of a method for producing a reticle, data are produced on a primary reticle pattern as divided into subfields each defining a respective portion of the pattern to be projected onto a the substrate in respective shots. A distribution of beam blur is determined. The distribution is a function of beam deflection for irradiating a given subfield of the primary reticle pattern and of a distribution of pattern elements within the given subfield. Data regarding the determined distribution of beam blur are stored. A beam-energy profile at the substrate exposed with the primary reticle pattern is determined. The data regarding the distribution of beam blur are recalled, and a cumulative exposure-energy distribution at the substrate exposed with the primary reticle pattern is determined, taking into account proximity effects in the exposed primary reticle pattern and the data on the distribution of beam blur. From the determined distribution of cumulative exposure energy, a dose threshold is determined. At the dose threshold, edge locations of pattern elements of the primary reticle pattern as projected are calculated. Based on the calculated edge locations, the primary pattern data are corrected so that edge locations correspond to respective edge locations according to design specifications. The corrections are made by local resizing of pattern elements, by local dose corrections, or both. Based on the corrected pattern data, the reticle is fabricated.

In the foregoing method, the distribution of beam blur can be determined as a mathematical function or a data table that is stored. The distribution of blur can be calculated as an isotropic distribution or as an anisotropic distribution. The calculation of edge locations of pattern elements as projected can include taking into consideration the distribution of beam blur. Also, the correction to the primary reticle pattern data can include taking into consideration a dose level and slope of the corresponding beam-energy distribution at the substrate. In correcting the primary reticle data by taking into consideration the dose level and slope of the corresponding beam-energy distribution at the substrate, a selected pattern portion (of the primary pattern) can be obtained by dividing a selected pattern portion into subregions each containing a respective portion of a pattern element. The pattern-element portion in each subregion can be represented as a respective representative figure having an area equal to an area of the respective pattern-element portion. With respect to each representative figure, fogging due to backscattering is calculated. From the calculated fogging for individual subregions, fogging for the element in the selected pattern portion is calculated. Based on data regarding fogging for the pattern element, a distribution of exposure energy at the edges of the pattern element can be calculated. In addition, slopes of the exposure-energy distribution at the edges of the pattern element can be calculated, wherein the primary pattern data can be corrected to a degree determined from the calculated slopes of exposure-energy distribution.

According to another aspect of the invention, reticles are provided that are produced by any of the various methods of the invention.

According to yet another aspect of the invention, methods are provided for performing CPB microlithography. In these methods, a reticle such as any summarized above are provided.

In yet another embodiment of a method, according to the invention, for correcting proximity effects by local resizing of pattern elements defined on the reticle, beam blur is determined. Beam blur is determined for each subfield to be projected onto the substrate in a respective shot of the charged particle beam, and is determined at each of multiple locations in the subfield. The blur data is stored in a retrievable form. The blur data are retrieved and utilized in calculations to modify profiles of respective pattern elements defined in the subfields as required to correct proximity effects that otherwise would be produced by projection of the subfields onto the substrate. Using the results of these calculations, the profiles of the respective pattern elements are modified.

Again, as noted above, the blur data can be stored as a data table or as a mathematical function, for example. Typically, the blur data differ from subfield to subfield of the pattern.

According to another aspect of the invention, computer-readable media are provided that comprise a computer program for executing any of the methods according to the invention.

The foregoing and additional features and advantages of the invention will be more readily apparent from the following detailed description, which proceeds with reference to the accompanying drawings.

BRIEF DESCRIPTION OF THE DRAWINGS

FIG. 10(A) shows a situation before changing the dimension of the respective element on the reticle, and FIG. 10(B) shows a situation after changing the shape of the respective element on the reticle.

DETAILED DESCRIPTION

The invention is described below in the context of multiple representative embodiments that are not intended to be limiting in any way. Also, whereas the embodiments are described in the context of charged-particle-beam (CPB) microlithography apparatus and methods employing a reticle that is projected onto a substrate, the methods and apparatus can be applied readily to direct-writing CPB microlithography that does not employ a reticle.

General Considerations

Figure 1:
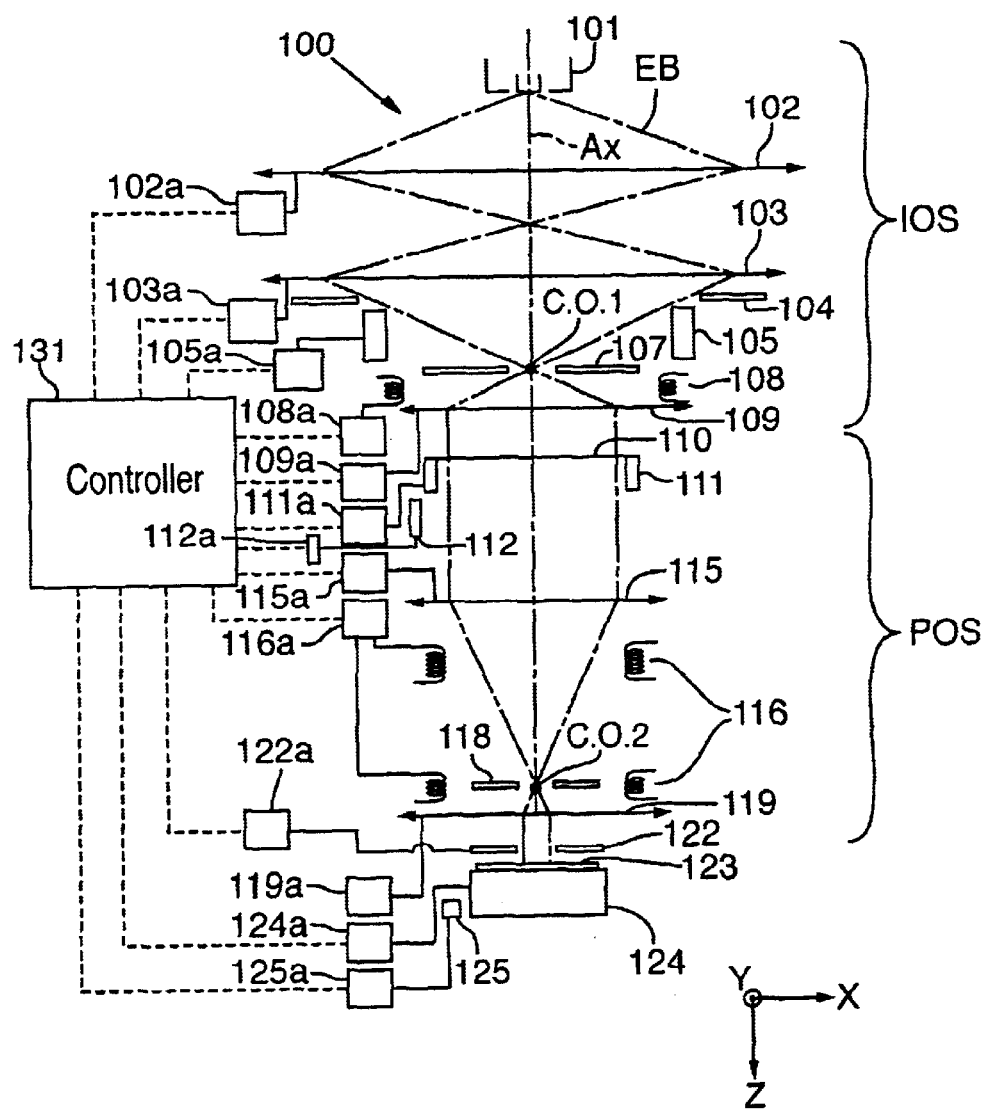
FIG. 1 is a schematic elevational diagram of a charged-particle-beam (CPB) microlithography apparatus, including imaging and control components, that can be used when performing a correction of proximity effects according to the invention.

A representative apparatus 100, including imaging and control components, for performing divided-reticle CPB microlithography is shown in FIG. 1. The apparatus of FIG. 1 is described in the context of using an electron beam as a lithographic energy beam. However, it will be understood that the general principles of the apparatus can be applied with equal facility to use of another type of charged particle beam, such as an ion beam.

An electron gun 101, situated at the extreme upstream end of the apparatus, serves as a source of an electron beam EB that propagates from the electron gun 101 in a downstream direction along an optical axis Ax. Downstream of the electron gun 101 are an illumination-optical system IOS and a projection-optical system POS. The illumination-optical system IOS is situated between the electron gun 101 and the reticle 110, and the projection-optical system POS is situated between the reticle 110 and the substrate (wafer) 123. The electron beam EB passing through the illumination-optical system IOS is termed the "illumination beam," and the beam passing through the projection-optical system POS is termed the "patterned beam" or "imaging beam."

This disclosure generally uses the term "reticle" to denote a transfer medium defining a pattern to be transferred lithographically to a substrate. Another term frequently used in the art is "mask." Hence, "reticle," "mask," and "transfer medium" are used interchangeably herein. Also, although a "substrate," as used herein, typically is a semiconductor wafer, a "substrate" generally can be any of various materials and configurations. The substrate often is referred to as "sensitive," meaning that the upstream-facing surface of the substrate includes a material (usually termed a "resist") that responds to exposure by a beam, propagating from the reticle, in a manner resulting in imprinting of the reticle pattern on the substrate surface. "Substrate" and "wafer" are used interchangeably herein.

The illumination-optical system IOS comprises a first condenser lens 102, a second condenser lens 103, a beam-shaping aperture 104, a blanking aperture 107, and an illumination lens 109. The condenser lenses 102, 103 converge the illumination beam to form a crossover C.O.1 at the blanking aperture 107.

The beam-shaping aperture 104 defines an opening that trims the illumination beam to a desired transverse profile, usually sufficient to illuminate a single subfield or other exposure unit on the reticle 110. Hence, the opening in the beam-shaping aperture 104 normally is square or rectangular in shape. For example, the opening can be sufficient to illuminate a square subfield, on the reticle, measuring from 0.5 mm to 5 mm on each side. An image of the opening in the beam-shaping aperture 104 is formed on the reticle 110 by the illumination lens 109 located downstream of an illumination-beam deflector 108.

Situated downstream of the beam-shaping aperture 104 is a blanking deflector 105. The blanking deflector 105 deflects the illumination beam sufficiently to cause the beam to strike, during "blanking," the opaque portion of the blanking aperture 107. Thus, the illumination beam is prevented from striking the reticle 110. Situated downstream of the blanking aperture 107 is the illumination-beam deflector 108. The illumination-beam deflector 108 scans the illumination beam, primarily in the X-direction (horizontally in FIG. 1), to illuminate the reticle subfields that lie within the optical field of the illumination-optical system IOS. The subfields are illuminated in a serial manner.

Although, in FIG. 1, the reticle 110 is shown having only one subfield (situated at the optical axis Ax), an actual reticle 110 would have a large number of subfields extending outward in a plane (X-Y plane) perpendicular to the optical axis Ax. The reticle 110 would define the entire pattern of the respective layer to be applied to a die (chip) on the substrate 123.

The reticle 110 is mounted on a reticle stage 111 that is movable within the X-Y plane. Thus, each of the subfields of the reticle 110 extending beyond the optical field of the illumination-optical system IOS can be illuminated. Installed on the reticle stage 111 is a position sensor 112. The position sensor 112 employs a laser interferometer to provide accurate real-time data on the position of the reticle stage 111.

The projection-optical system POS comprises a first projection lens 115, a second projection lens 119, and an image-position deflector 116. A respective image acquired by the imaging beam upon passage of the beam through a subfield of the reticle 110 is formed by the projection-optical system POS in the prescribed location on the substrate 123. So as to be imprintable with the image, the substrate 123 is coated with an appropriate resist that is sensitive to exposure by electrons in the patterned beam. The projection lenses 115, 119 collectively have a demagnification ratio according to which the projection lenses 115, 119 form a demagnified image of the illuminated region of the reticle 110 on the substrate 123.

A crossover C.O.2 is formed on the optical axis Ax at a point that divides the axial distance between the reticle 110 and the substrate 123 into segments having respective axial lengths proportional to the demagnification ratio. A contrast aperture 118 is situated at the crossover C.O.2. The contrast aperture 118 blocks any electrons of the patterned beam that were scattered by non-patterned portions of the reticle 110, thereby preventing the scattered electrons from reaching the substrate 123.

Situated just upstream of the substrate 123 is a backscattered-electron (BSE) detector 122. The BSE detector 122 detects electrons backscattered from a mark provided on an unexposed surface of the substrate 123, or on the wafer stage 124. A mark on the substrate 123, for example, can be scanned by a beam that has passed through a suitable mark pattern on the reticle 110. The relative positions of the reticle 110 and substrate 123 can be determined by detecting electrons backscattered from the mark on the substrate 123.

The substrate 123 is mounted via an electrostatic chuck (not shown) on the wafer stage 124. The subfields in the pattern, arranged in rows and stripes extending beyond the optical field of the illumination-optical system, are scanned by controlled movements of the wafer stage 124 to permit the subfields to be exposed in a sequential manner. During such scanning, the reticle stage 111 and wafer stage 124 position sensor 125 that is similar in configuration and operation to the position sensor 112, as described above, for the reticle stage 111.

Each of the lenses 102, 103, 109, 115, 119 and deflectors 105, 108, 116 has a respective controlled power supply 102a, 103a, 109a, 115a, 119a, 105a, 108a, 116a, respectively. The power supplies are connected to and controlled by a controller 131. Similarly, the reticle stage 111 and wafer stage 124 have respective stage drivers 111a, 124a. The stage drivers 111a, 124a are connected to and controlled by the controller 131. The stage-position detectors 112, 125 route respective stage-position data to the controller 131 via respective interfaces 112a, 125a. Each interface 112a, 125a includes an amplifier and an analog-to-digital (A/D) converter. The BSE detector 122 routes signals to the controller 131 through a respective interface 122a.

The controller 131 determines errors in stage-position control, and corrects these errors by energizing the image-position deflector 116 in an appropriate manner. Thus, a reduced image of the illuminated reticle subfield can be transferred accurately to a target location on the substrate 123. On the substrate 123, the respective subfield images are stitched together in a contiguous manner to achieve transfer of an entire chip pattern from the reticle to the substrate.

Figure 2:
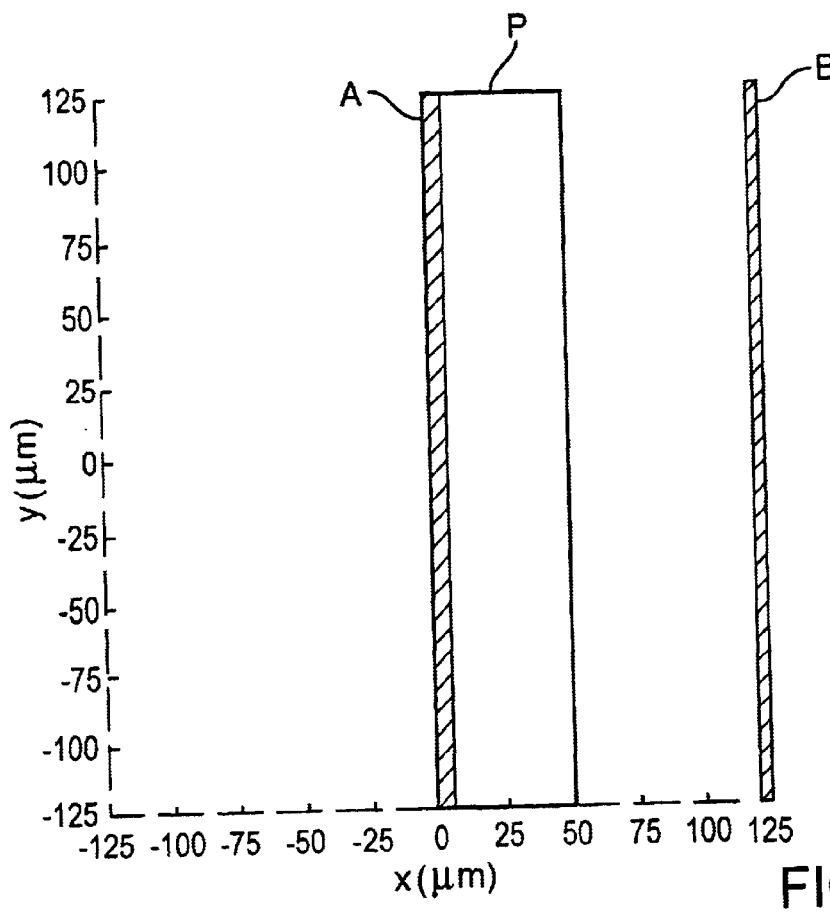
FIG. 2 shows an exemplary portion of a reticle pattern to be produced on a sensitive substrate by projection transfer (e.g., using the apparatus of FIG. 1).

Turning now to the influence of proximity effects, FIG. 2 shows an exemplary portion of a pattern to be produced on the substrate. The depicted pattern portion is contained within a subfield and consists of a "pad" element P that is 50 $\mu$m wide and two "line" elements A and B each 100 nm wide. The pad element P is separated from the line element A by an X-distance of 100 nm, and separated from the line element B by an X-distance of 70 $\mu$m (FIG. 3).

Assume that the pattern portion shown in FIG. 2 is to be transferred, e.g., using an apparatus as shown in FIG. 1. Assume also that the subfield containing the pattern portion of FIG. 2 has a square profile, measuring 250 $\mu$m×250 $\mu$m. Although a demagnification ratio of 1/4 or 1/5 normally is used when projecting the pattern by CPB microlithography, to simplify the explanation, assume that the demagnification ratio is 1:1.

Figure 3:
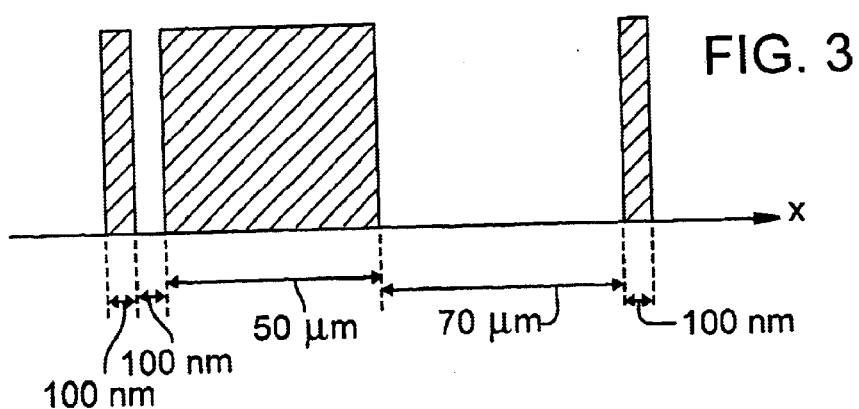
FIG. 3 shows the beam-energy profile of the patterned beam immediately downstream of the illuminated subfield, on the reticle, defining the pattern portion shown in FIG. 2. The FIG. 3 profile is along a lateral line extending through y=0 (with the center of the subfield as the origin, and the X- and Y-axes extending parallel to the sides of the subfield).

FIG. 3 shows the beam-energy profile of the patterned beam immediately downstream of the illuminated subfield on the reticle, along a lateral line extending through y=0 (with the center of the subfield as the origin, and the X- and Y-axes extending parallel to the sides of the square subfield). Disregarding any blur, the beam-energy profile shown in FIG. 3 exhibits extremely steep (i.e., vertical) changes in amplitude with corresponding changes in position at the edges of the elements A, P, B. DR(x), the beam-energy profile on the line y=0 immediately after passing through the reticle, is a function of x (position on X-axis), as expressed by the following:

DR(x)=1.0 for values of x within the beam-transmitting area of the subfield

DR(x)=0.0 for values of x within the beam-blocking area of the subfield

At a point immediately upstream of where the patterned beam enters the resist layer on the upstream-facing surface of the substrate, the slope of the beam-energy profile is reduced substantially (compared to FIG. 3) by blur imposed by the CPB optical system through which the patterned beam has passed. DW(x), the exposure-energy distribution at the upstream-facing surface of the substrate, can be expressed by Equation (1):

$$DW(x) = \frac{1}{\sqrt{\pi}\,\beta} \int \exp\left[-\frac{(x-x')^2}{\beta^2}\right] DR(x')dx' \quad (1)$$

wherein $\beta$ is the standard deviation of the optical-system blur having a Gaussian distribution, and x' is the integral parameter (integration is performed over the pattern region). As discussed earlier, the magnitude of the optical-system blur is a function of, e.g., the size of the subfield and the area ratio of pattern-element regions to non-element regions of the pattern portion defined in the subfield.

The assumed Gaussian distribution of blur is to simplify the discussion, but it will be understood that a similar analysis can be conducted of blur actually having any of various other distributions. In a Gaussian distribution, blur is a function of r (the distance, within the subfield, of a subject point on the distribution from the subfield center), as expressed by Equation (2), below. The range of integration is the range of the region DR(x')=1. This range in this example is 0 to 120.3 $\mu$m, but the range generally can be any suitable range within $-\infty$ to $+\infty$.

blur(nm)=70 nm+(0.25)r(nm)    (2)

wherein r is in $\mu$m. In this instance, the relationship between $\beta$ and blur is given by:

$\beta \approx 0.6 \ast$blur    (3)

According to Equation (2), the magnitude of blur is 70 nm at the subfield center, and 100 nm at the point (x, y)=(120 $\mu$m, 0 $\mu$m).

In this manner, the magnitude of blur at each point within the subfield is determined using Equation (2). From the calculated magnitudes of blur, Equation (3) is used to determine $\beta$. The determined value of $\beta$ is used in Equation (1) to determine the beam-energy profile.

Figure 4A:
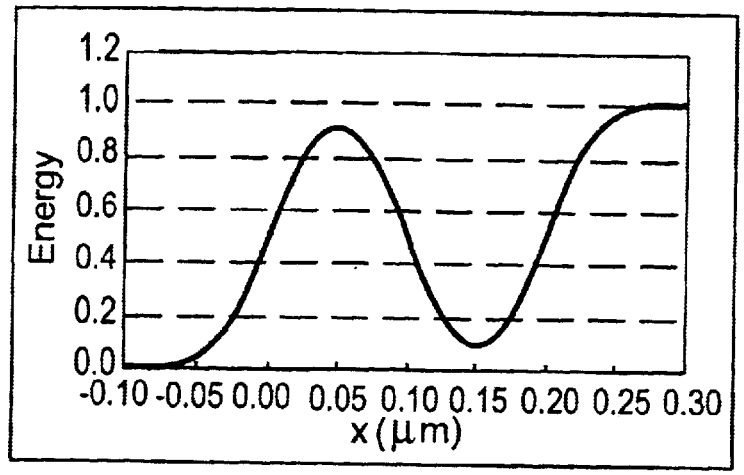
FIGS. 4(A)–4(C) collectively show an energy profile, immediately upstream of the surface of a sensitive substrate, of an electron beam patterned with the pattern portion shown in FIG. 2. Each of FIGS. 4(A)–4(C) shows a different respective portion of the profile. The depicted profile is as altered by blur imparted to the beam by the projection-optical system through which the beam has passed from the reticle to the substrate.
Figure 4B:
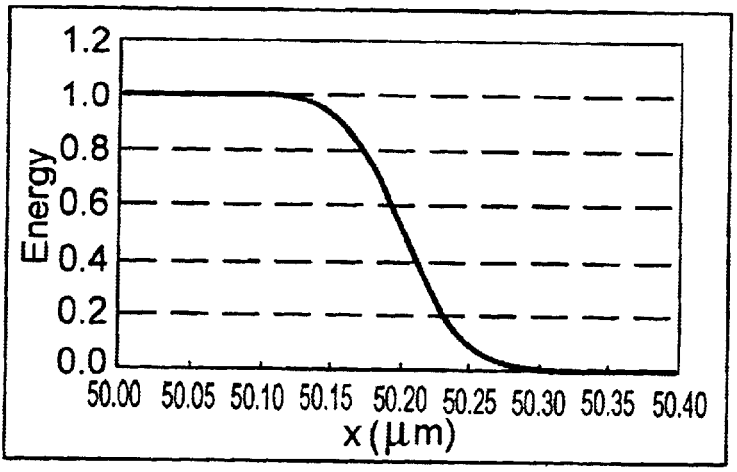
Figure 4C:
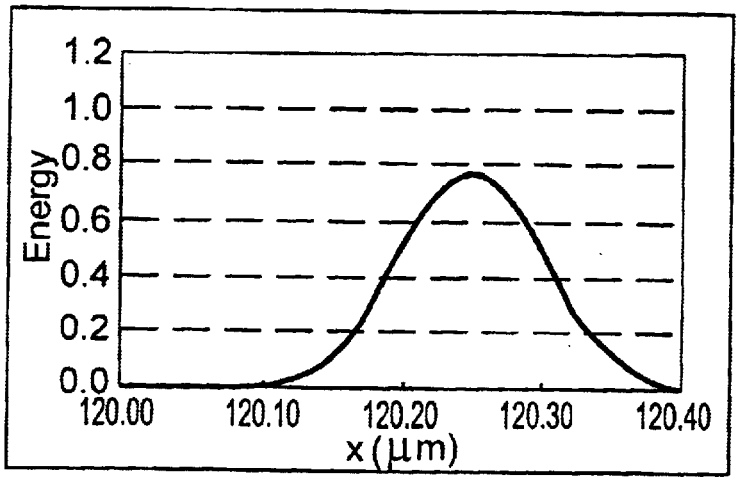

FIGS. 4(A)–4(C) collectively provide a plot of DW(x), i.e., the beam-energy distribution along the y=0 line at the upstream-facing surface of the substrate. Each of FIGS. 4(A)–4(C) provides a different portion of the plot along the abscissa:

FIG. 4(A): from x=−0.1 $\mu$m to x=0.3 $\mu$m

FIG. 4(B): from x=50.0 $\mu$m to x=50.4 $\mu$m

FIG. 4(C): from x=120.0 $\mu$m to x=120.4 $\mu$m The individual values of beam energy as plotted on the ordinate are normalized data obtained by dividing respective individual values by the maximum energy (magnitude of energy of the plateau-shaped portion of the distribution at the center of the pad element P).

A careful examination reveals that the blur increases from FIG. 4(A) to FIG. 4(B) and from FIG. 4(B) to FIG. 4(C). I.e., the slope of the energy distribution becomes increasingly shallow from FIG. 4(A) to FIG. 4(C).

As electrons of the patterned beam penetrate the sensitive substrate, they scatter, giving rise to a proximity effect. E(x), the amount of energy accumulated in the substrate after scattering, can be expressed, for example, by the following equations:

$$E(x) = E_b(x) + E_f(x) \tag{4}$$

$$E_b(x) = \left(\frac{\eta}{1+\eta}\right)\left(\frac{1}{\sqrt{\pi}\,\sigma_b}\right)\int \exp\left[-\frac{(x-x')^2}{\sigma_b^2}\right] DW(x')dx' \tag{5}$$

$$E_f(x) = \left(\frac{\eta}{1+\eta}\right)\left(\frac{1}{\sqrt{\pi}\,\sigma_f}\right)\int \exp\left[-\frac{(x-x')^2}{\sigma_f^2}\right] DW(x')dx' \tag{6}$$

wherein η is a backscatter coefficient, $\sigma_b$ is the diameter of the backscatter, and $\sigma_f$ is the diameter of the forward-scatter. The range of integration is the range within the region in which DW(x) is not 0.

Values of η=0.4, $\sigma_b$=31.2 μm, and $\sigma_f$=7 μm, at an electron-acceleration voltage of 100 keV, were used in the following calculations.

Figure 5A:
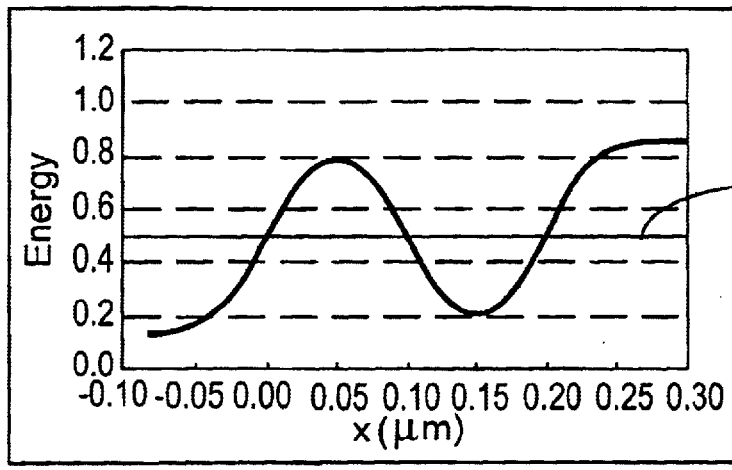
FIGS. 5(A)–5(C) depict respective regions of a plot of cumulative exposure energy, with proximity effects accounted for, in the layer of resist on the sensitive substrate, as exposed with a patterned beam profiled as shown in FIGS. 4(A)–4(C), respectively.
Figure 5B:
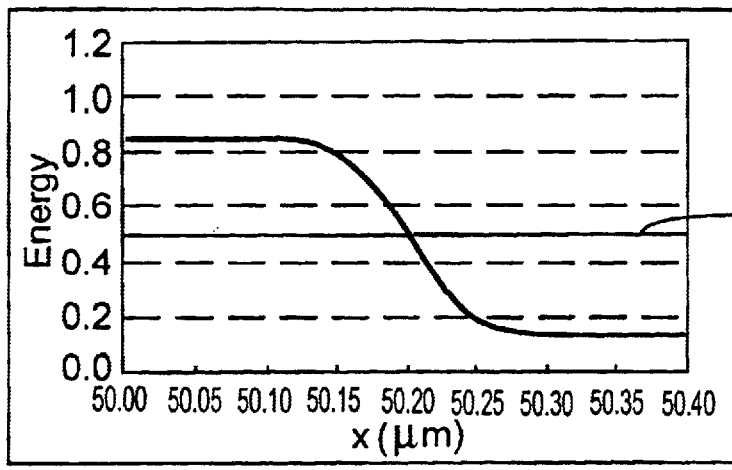
Figure 5C:
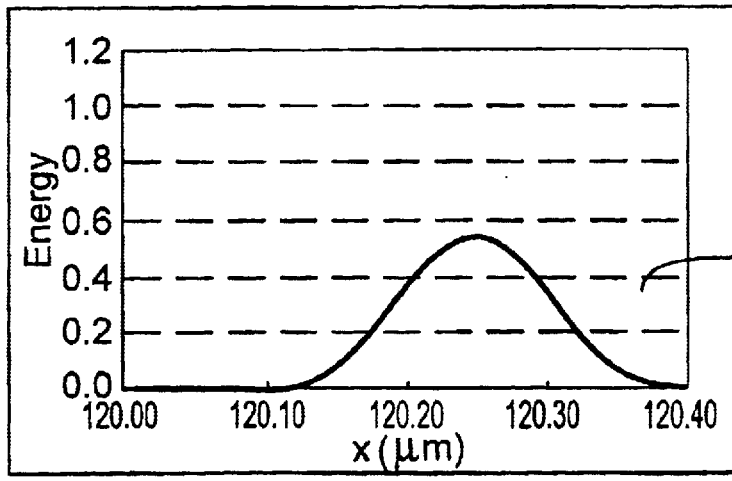

FIGS. 5(A)–5(C) depict respective regions of a plot of the final cumulative exposure energy in the layer of resist on the sensitive substrate, with proximity effects accounted for. Each of FIGS. 5(A)–5(C) provides a different portion of the plot along the abscissa (as in FIGS. 4(A)–4(C)):

FIG. 5(A): from x=−0.1 μm to x=0.3 μm

FIG. 5(B): from x=50.0 μm to x=50.4 μm

FIG. 5(C): from x=120.0 μm to x=120.4 μm

In the graph of FIGS. 5(A)–5(C), the beam-energy data as plotted on the ordinate were normalized data, obtained by dividing actual data by the maximum value of cumulative exposure energy received at the surface of the sensitive substrate (i.e., in the resist), with proximity effects and blur taken into consideration. For example, the maximum value of cumulative exposure energy is the exposure energy received at the center of a plateau-shaped portion of the cumulative energy distribution of the pattern as exposed into the resist. The maximum value is established at a location where the width of the respective pattern feature is substantially greater than the width over which electrons are scattered, and also greater than the width of the optical-system blur.

In an ideal case (i.e., an exposure process exhibiting no manufacturing error) it can be assumed that a pattern element will be imprinted in the resist where the beam-energy profile exceeds an appropriately determined threshold, and that no pattern element will be formed where the threshold is not exceeded by beam energy. The thresholds 40, 41, 42 as shown in FIGS. 5(A)–5(C), respectively, are established so that the boundaries of the pattern elements as imprinted in the resist will be in respective locations representing accurate transfer of the pattern elements in their desired shapes and sizes. The thresholds 40, 41 are essentially the same, while the threshold 42 is significantly lower than the other two. With a threshold at a value represented by the lines 40 and 41, the width of the line element B (in the region encompassed by FIG. 5(C)) as exposed is thinner than desired. Conversely, with a threshold at a value represented by the line 42, the boundaries of the line element A and of the pad element P (in the region encompassed by FIG. 5(A)) are well outside the desired boundaries.

Conventionally, to solve such a problem, pattern elements as defined on the reticle are altered (locally resized) to improve the fidelity of the pattern elements as imprinted in the resist with the desired profiles of the imprinted pattern elements. In making the local-resizing alterations, however, it conventionally is assumed that blur is uniform throughout any given subfield. As discussed above, the blur within a subfield typically is not uniform.

First Representative Embodiment

Figure 6:
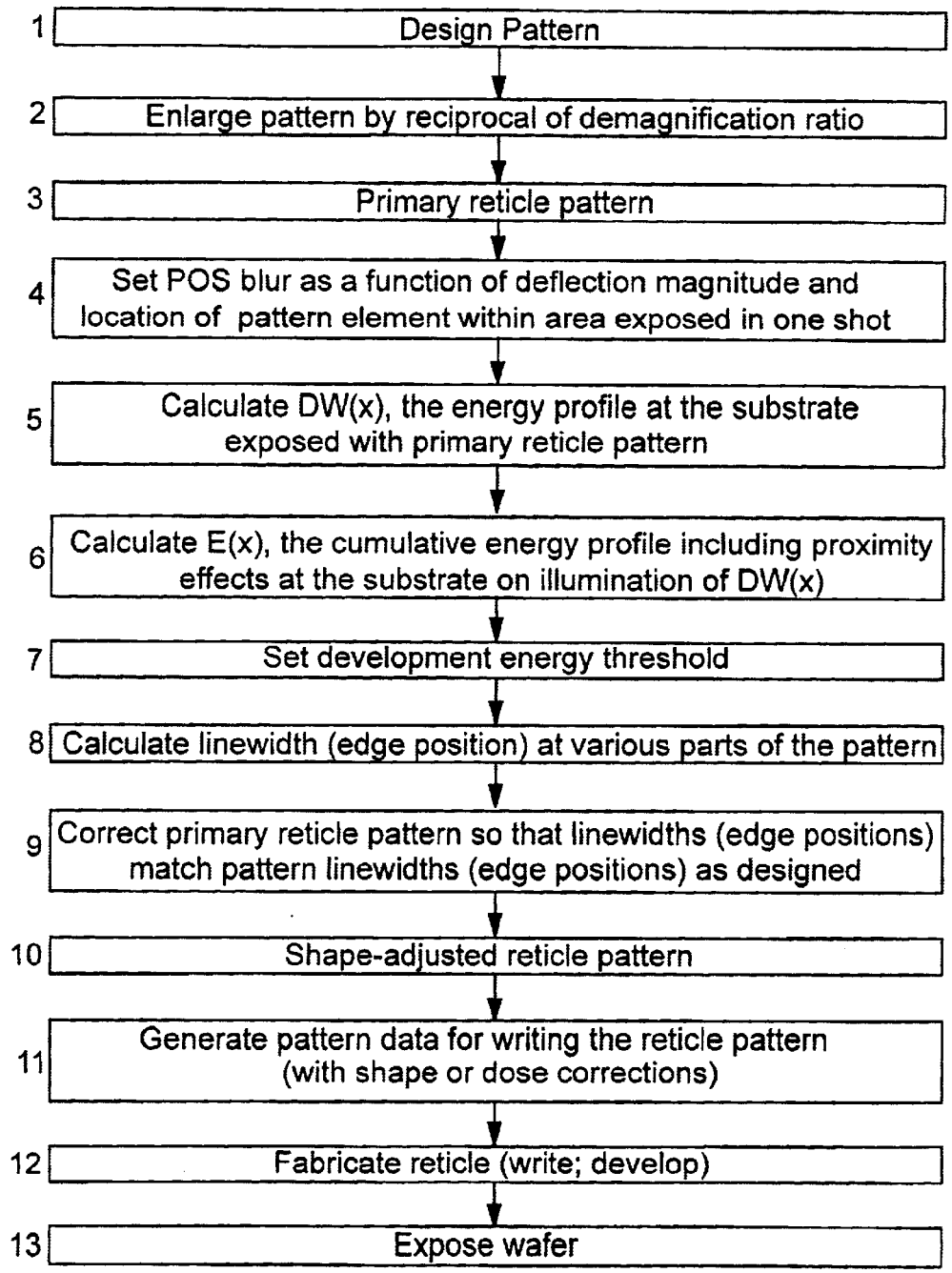
FIG. 6 is a flow chart of key steps of a method, according to the first representative embodiment, for fabricating a reticle defining a pattern in which proximity effects have been corrected according to the invention.

This embodiment is directed to a proximity-effect-correction method according to the invention. FIG. 6 is a flow chart of key steps of the method, as performed to fabricate a reticle pattern and expose a wafer with the reticle pattern using the proximity-effect-correction method of this embodiment.

In step 1, the pattern to be formed on the substrate is designed. To obtain a primary reticle pattern (step 3), the designed pattern is enlarged in step 2 by the reciprocal of the demagnification ratio that will be used when the pattern is transferred microlithographically. In step 4, the blur of the projection-optical system (POS) is determined. The determined blur is a function of the magnitude of beam deflection and the location of a respective pattern element within the area (e.g., subfield) to be exposed in one shot. In step 5, a beam-energy profile, DW(x), is calculated, wherein DW(x) is the distribution of energy over the surface of the sensitive substrate when the substrate is being exposed with the primary reticle pattern.

In step 6, a profile E(x) of cumulative energy is calculated. More specifically, E(x) is the distribution of cumulative exposure energy (dose), including the influence of proximity effects, on the sensitive substrate receiving an irradiation dose having the energy profile DW(x)). In step 7, a development-energy threshold is set such that the edges of pattern elements formed in various parts of the pattern on the wafer, according to the cumulative energy profile E(x), will be at or acceptably near the respective prescribed locations. In step 8, linewidths (edge locations) are calculated for various parts of the pattern, at the development-energy threshold. In step 9, the primary reticle pattern is corrected such that the linewidths (edge locations) match the corresponding linewidths (edge locations) of respective elements of the design pattern. This can be done by making localized shape corrections of pattern elements or by making dose corrections, yielding a shape-adjusted reticle pattern (step 10). During step 11, in which pattern data are generated for "writing" the reticle, proximity effects that would occur during the writing of the reticle pattern also are corrected by incorporating these pattern-element shape or dose corrections. After writing the reticle, development is performed to complete fabrication of the reticle (step 12). The reticle then can be used to expose wafers (step 13).

Figure 7A:
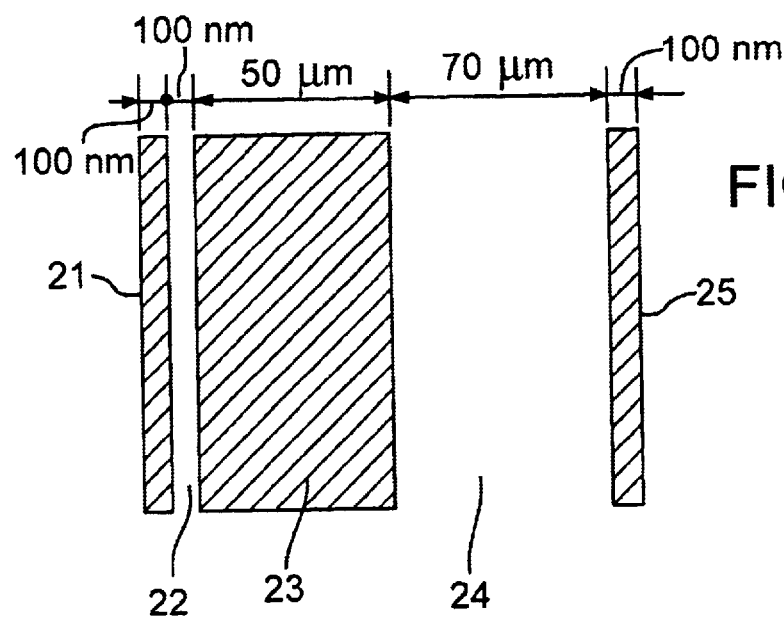
FIG. 7(A) shows an exemplary portion of a reticle pattern to be produced on a sensitive substrate using a method according to the first representative embodiment and a CPB microlithography apparatus such as that shown in FIG. 1.

FIG. 7(A) is a plan view of a portion of a representative prescribed pattern ("design pattern") to be obtained on a wafer (sensitive substrate) using the proximity-effect correction method according to this embodiment. Shown from left to right in the drawing are a narrow-line pattern element (line) 21, a narrow space 22, a wide-line pattern element (pad) 23, a wide space 24, and a narrow-line pattern element (line) 25. Each of the lines 21, 25 and the space 22 is 100 nm wide. The width of the pad 23 is 50 μm, and the width of the space 24 is 70 μm. The scale of the drawing has been adjusted for clarity.

Assume that a square (250×250 μm) subfield containing the pattern portion shown in FIG. 7(A) is to be transferred by divided-reticle CPB microlithography. The usual demagnification ratio of the microlithography apparatus is 1/4 or 1/5. But, to simplify the description, assume that the demagnification ratio is unity; also assume that the electron beam used for exposure is accelerated to 100 keV.

Figure 7B:
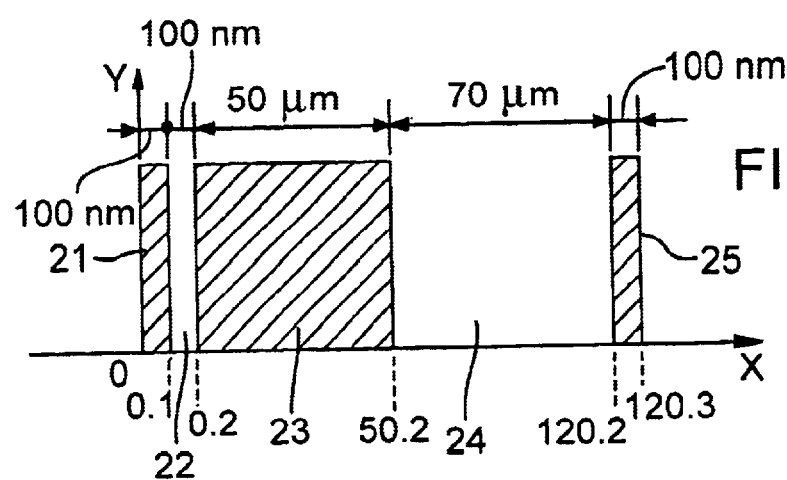
FIG. 7(B) shows the beam-energy profile of the patterned beam immediately downstream of the illuminated subfield, on the reticle, defining the pattern portion shown in FIG. 7(A).

FIG. 7(B) shows the energy profile immediately downstream of the reticle. In the plot, the ordinate is energy magnitude and the abscissa is horizontal position. In FIG. 7(B), because optical-system blur does not have any appreciable effect yet, the energy profile changes abruptly with changes in horizontal position extending over an edge of a pattern element. DR(x), the energy profile immediately downstream of the reticle is a function of x, expressed as follows:

DR(x)=1.0(0.0≤x≤0.1, 0.2≤x≤50.2, 120.2≤x≤120.3)

DR(x)=0.0(x<0.0, 0.1<x<0.2, 50.2<x<120.2, 120.3<x)

At a point immediately upstream of the surface of the substrate, however, the respective slopes of the rising and falling edges of the energy profile are reduced (blurred) by optical-system blur. This blurred energy profile DW(x) is expressed by the following equation:

$$DW(x) = \frac{1}{\sqrt{\pi}\,\beta}\int \exp\left[-\frac{(x-x')^2}{\beta^2}\right]DR(x')dx' \quad (7)$$

wherein β is the standard deviation of optical-system blur having a Gaussian distribution.

As mentioned earlier, the optical-system blur is determined by factors such as the magnitude of beam deflection, the size of the subfield, and the area ratio of pattern elements to non-elements in the respective region of the pattern. To simplify the description, assume that optical-system blur is a function of r, the distance of a subject point, within the subfield, from the center of the subfield, as given by the following:

blur(nm)=70 nm+(0.25)r(nm)  (8)

wherein r is in μm. According to the equation above, 70 nm of blur would exist at the center of the subfield and 100 nm of blur would exist at the measurement point (x, y)=(120 μm, 0 μm).

Figure 8A:
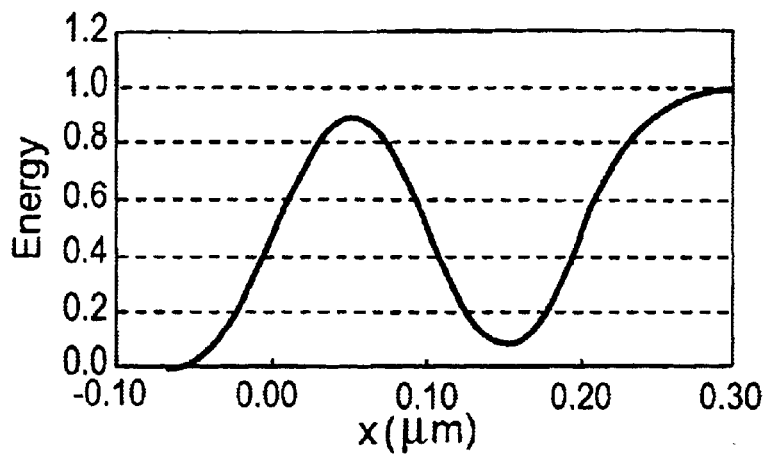
FIGS. 8(A)–8(C) depict respective regions of a plot of the beam-energy profile immediately upstream of the surface of the substrate exposed with the patterned beam of FIG. 7(B), with beam blur taken into account, as described in the first representative embodiment.
Figure 8B:
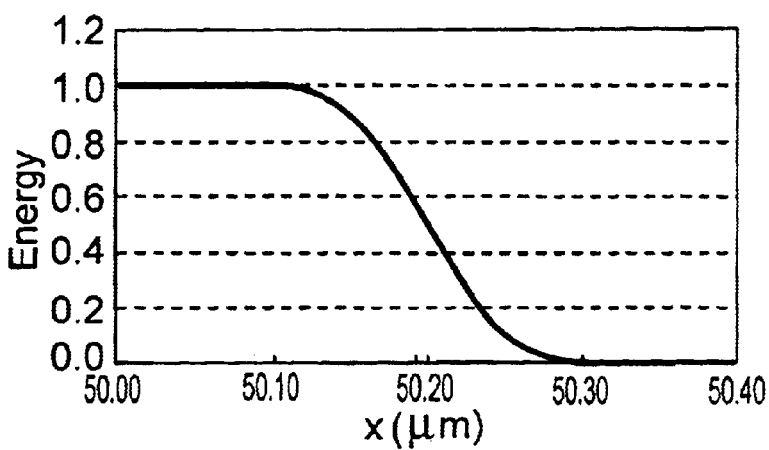
Figure 8C:
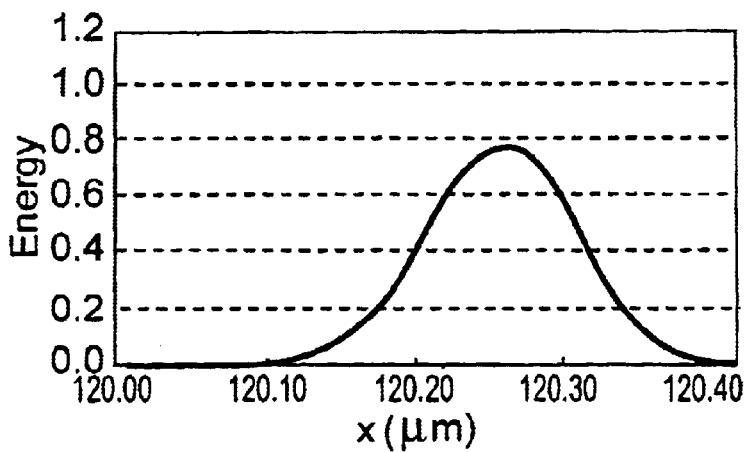

FIGS. 8(A)–8(C) collectively constitute a representative plot of DW(x), the energy profile immediately upstream of the surface of the substrate with blur taken into account. On the ordinate, the value of maximum energy was set at unity and all energy data as plotted were normalized to the maximum energy. FIGS. 8(A)–8(C) show the energy profile DW(x) over three respective ranges of x:

FIG. 8(A): from x=−0.1 μm to x=0.3 μm

FIG. 8(B): from x=50.0 μm to x=50.4 μm

FIG. 8(C): from x=120.0 μm to x=120.4 μm

Because the plot of FIG. 8(B) encompasses a range that is closer to the edge of the subfield than the plot of FIG. 8(A), and the plot of FIG. 8(C) encompasses a range that is closer to the subfield edge than the plot of FIG. 8(B), the blur is greatest in FIG. 8(C), lowest in FIG. 8(A), and intermediate in FIG. 8(B). I.e., the slope of the energy distribution decreases from FIG. 8(A) to FIG. 8(C).

As incident charged particles of the patterned beam penetrate into the layer of resist on the upstream-facing surface of the substrate, the particles scatter, giving rise to a proximity effect. E(x), the magnitude of cumulative exposure energy at the substrate resulting from the proximity effect, can be expressed, for example, by the following:

E(x)=E_b(x)+E_f(x)  (9)

In the foregoing expression, $$E_b(x) = \left(\frac{\eta}{1+\eta}\right)\left(\frac{1}{\sqrt{\pi}\,\sigma_b}\right)\int \exp\left[-\frac{(x-x')^2}{\sigma_b^2}\right]DW(x')dx' \quad (10)$$

and $$E_f(x) = \left(\frac{\eta}{1+\eta}\right)\left(\frac{1}{\sqrt{\pi}\,\sigma_f}\right)\int \exp\left[-\frac{(x-x')^2}{\sigma_f^2}\right]DW(x')dx' \quad (11)$$

and
wherein η is a backscatter coefficient, $\sigma_b$ is the diameter of the backscatter, and $\sigma_f$ is the diameter of forward-scatter. For these calculations, if the charged particles are electrons, then values of η=0.4, $\sigma_b$=31.2 μm, and $\sigma_f$=7 nm can be regarded as typical for a beam-acceleration voltage of 100 keV.

Figure 9A:
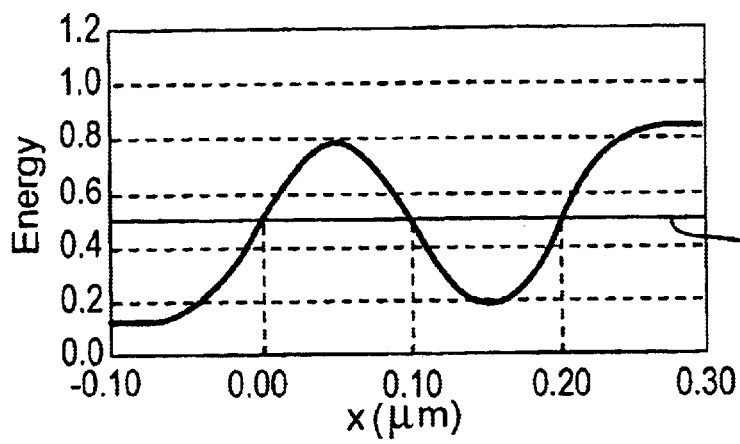
FIGS. 9(A)–9(C) depict respective regions of a plot of the distribution of cumulative exposure energy in the resist of the substrate exposed with a beam having a beam-energy profile as shown in FIGS. 8(A)–8(C).
Figure 9B:
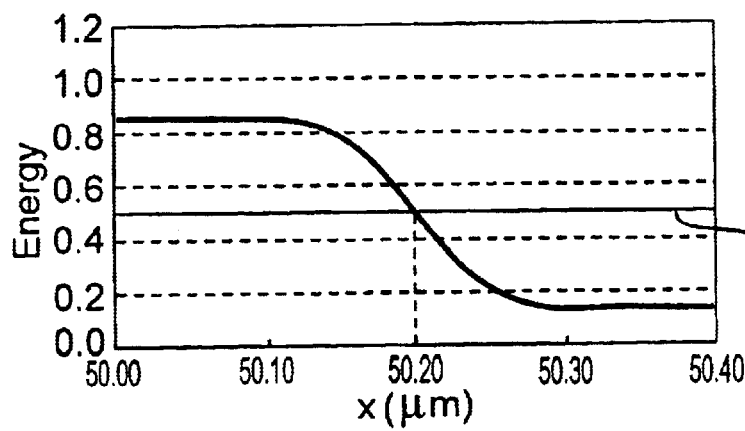
Figure 9C:
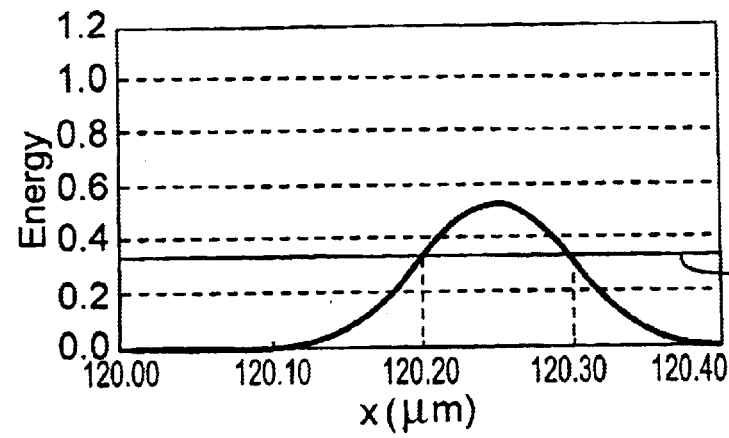

FIGS. 9(A)–9(C) collectively constitute a representative plot of E(x), the distribution of cumulative exposure energy in the resist, taking into account proximity effects. The plotted energy data are normalized as described above. FIGS. 9(A)–9(C) show the energy profile E(x) over the same three respective ranges of x as in FIGS. 8(A)–8(C):

FIG. 9(A): from x=−0.1 μm to x=0.3 μm

FIG. 9(B): from x=50.0 μm to x=50.4 μm

FIG. 9(C): from x=120.0 μm to x=120.4 μm

In an ideal situation (i.e., a microlithographic process having no manufacturing error) it can be assumed that a pattern element will be imprinted in the resist wherever the cumulative exposure energy associated with the element exceeds an appropriately determined threshold value, and that no imprinting will occur wherever the cumulative exposure energy is below the threshold. In FIGS. 9(A)–9(C), exposure-energy thresholds are indicated by the lines 30, 31, 32, respectively. The thresholds are established at respective values ensuring that the edges of pattern elements located in the respective regions will be located in their respective prescribed locations. As can be seen, the respective values of the thresholds 30 and 31 are essentially the same, while the value of the threshold 32 is significantly lower than the other two. If the threshold 32 were to be more nearly equal to the thresholds 30, 31, then the linear element 25 of FIGS. 7(A)–7(B) as imprinted in the resist would be too narrow. Conversely, if the thresholds 30, 31 were equal to the threshold 32, then the linear element 25 as imprinted in the resist would be too wide, the space 22 would be too narrow, and the width of the pad-like element 23 would be too large. As the respective widths of the elements as imprinted are changed in this manner, the respective edges of the elements are significantly displaced from their prescribed locations.

Second Representative Embodiment

This embodiment is directed to a method for making corrections whenever pattern elements as imprinted on the resist have linewidth or shape inaccuracies due to blur and proximity effects.

Figure 10A:
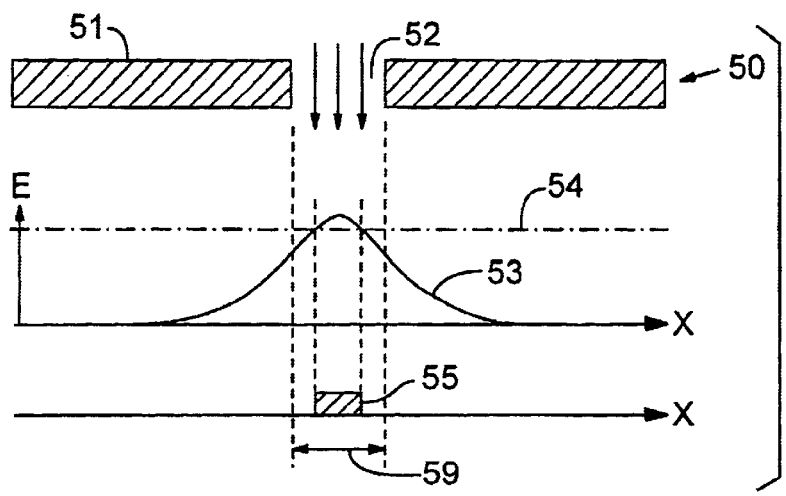
FIGS. 10(A)–10(B) show the relationship between a change in a pattern-element dimension on the reticle and the resulting change in the distribution of cumulative exposure energy at the corresponding region on the surface of the sensitive substrate.
Figure 10B:
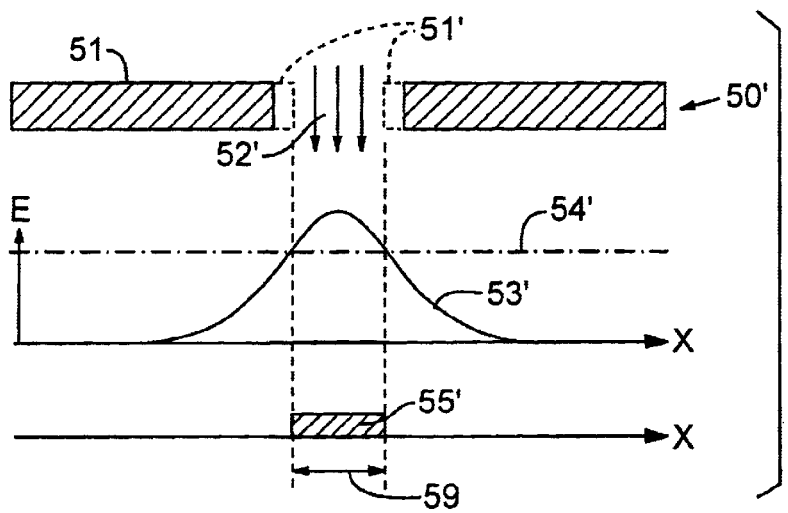

FIGS. 10(A)–10(B) show the relationship between a change in a pattern-element dimension on the reticle and the resulting change in the distribution of cumulative exposure energy at the corresponding region on the surface of the sensitive substrate. FIG. 10(A) shows a situation before changing the dimension of the respective element on the reticle, and FIG. 10(B) shows a situation after changing the shape of the respective element on the reticle.

A portion of a reticle 50 is shown at the top of FIG. 10(A). The reticle portion 50 includes a "CPB-blocking" (i.e., CPB-scattering or CPB-absorbing) portion 51 that "blocks" (i.e., scatters or absorbs, respectively) incident charged particles. In the center of the depicted CPB-blocking portion 51 is a CPB-transparent portion 52 that transmits incident charged particles. Shown beneath the reticle portion 50 is a plot of the distribution 53 of cumulative exposure energy at the sensitive substrate, taking into account blur imposed by the CPB optical system and charged-particle scattering in the resist on the substrate. An energy threshold 54 is shown in FIG. 10(A) as a horizontal broken line extending through the distribution 53 of cumulative exposure energy. Also shown, at the bottom of the drawing, is the corresponding pattern element 55 that would be imprinted in the resist on the surface of the substrate with the distribution 53 of cumulative exposure energy "sliced" by the threshold 54 as shown. The vertical dashed lines flanking the pattern element 55 denote the prescribed linewidth 59 of the particular element 55.

In FIG. 10(A), no correction has been made to modify the dimensions or profile of the pattern element on the reticle. Since a small (and in this case insufficient) portion of the distribution 53 exceeds the threshold 54, the corresponding dimension of the element 55 as imprinted on the sensitive substrate is less than the prescribed linewidth 59.

Turning now to FIG. 10(B), a portion of a reticle 50' is depicted at the top of the figure. The reticle 50' comprises a "CPB-blocking" (i.e., CPB-scattering or CPB-absorbing) portion 51 that blocks (i.e., scatters or absorbs, respectively) incident charged particles. In the center of the depicted CPB-blocking portion 51 is a width-corrected CPB-transparent portion 52' that transmits incident charged particles. The CPB-transparent portion 52' corresponds to the CPB-transparent portion 52 of FIG. 10(A) but with portions 51' of the CPB-blocking portion 51 removed from each side. Hence, the CPB-transparent portion 52' in FIG. 10(B) is wider than the CPB-transparent portion 52 in FIG. 10(A). Below the reticle 50' is a plot of the distribution 53' of cumulative exposure energy. The distribution 53' differs from the distribution 53 of FIG. 10(A) due to the wider CPB-transparent portion 52' in FIG. 10(B). An energy threshold 54' (horizontal broken line) extends through the cumulative energy distribution 53' at the same level as the energy threshold 54 in FIG. 10(A). But, in FIG. 10(B), a wider portion of the distribution 53' (and thus more of the distribution 53') resides above the threshold 54'. Shown at the bottom of FIG. 10(B) is a pattern element 55' that would be imprinted in the resist on the surface of the substrate with the cumulative energy distribution 53' "sliced" by the threshold 54' as shown. The vertical dashed lines flanking the pattern element 55' denote the prescribed linewidth 59 of the pattern element.

As can be seen, in FIG. 10(B), the width of the pattern element 55' is equal to the prescribed linewidth 59 due to the correction in which the dimension of the corresponding element as defined on the reticle 50' was changed. Dimension and/or shape modification of the element on the reticle 50' is performed by calculating a corrected width 52' at which the width of the element 55' as imprinted will be equal to the prescribed linewidth 59. The corrected width 52' typically is changed incrementally. The distribution of cumulative exposure energy is calculated for each increment until a corrected width 52' is obtained that results in a pattern-element width 55' that is equal to the prescribed linewidth 59.

Figure 11A:
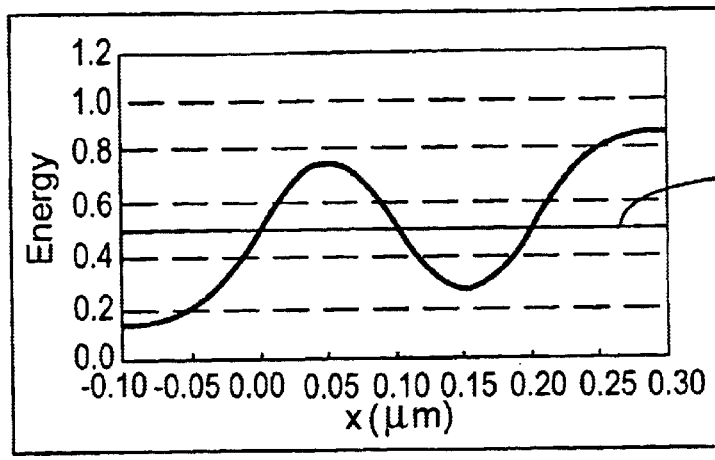
FIGS. 11(A)–11(C) depict respective regions of a plot of the distribution of cumulative exposure energy in the resist of a substrate, wherein profiles of pattern elements as defined on the reticle were modified according to conventional practice to correct for proximity effects.
Figure 11B:
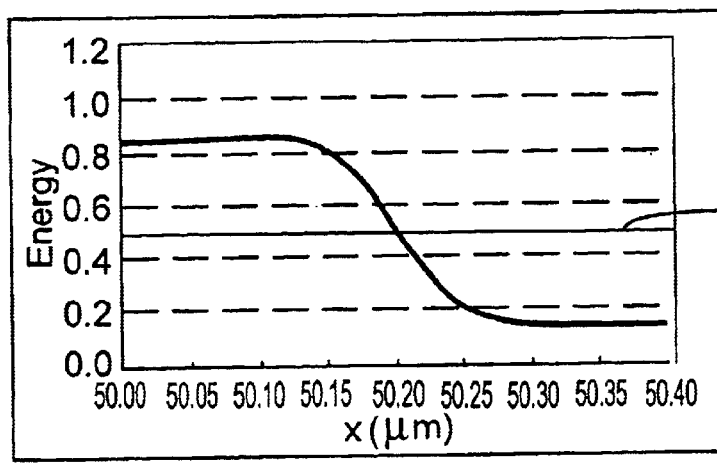
Figure 11C:
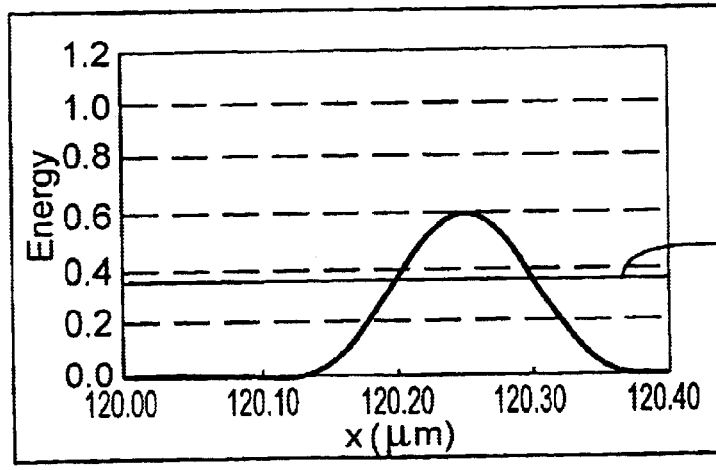

FIGS. 11(A)–11(C) depict respective regions of a plot of the cumulative exposure energy (normalized data, as described above) in the layer of resist on the sensitive substrate, wherein profiles of pattern elements (as defined on the reticle) were modified, according to conventional practice, to correct for proximity effects. I.e., in accordance with conventional practice, pattern-element profiles were modified on the reticle under the assumption that blur was a constant 85 nm throughout the subfield. (But, in the calculations to determine the distribution of cumulative exposure energy, variation of blur within the subfield was taken into consideration.)

Each of FIGS. 11(A)–11(C) provides a different portion of the plot along the abscissa (as in FIGS. 5(A)–5(C)):

FIG. 11(A): from x=−0.1 μm to x=0.3 μm

FIG. 11(B): from x=50.0 μm to x=50.4 μm

FIG. 11(C): from x=120.0 μm to x=120.4 μm

The respective thresholds 60, 61, 62 are selected so as to cause the boundaries of pattern elements formed in their respective regions to match the desired pattern-element boundaries. Although these thresholds are a bit closer to each other than those of FIGS. 5(A)–5(C), a substantial difference nevertheless exists between the value of the threshold 62 and the value of the thresholds 60, 61. Under such conditions, considering the elements A, P, B shown in FIG. 2, for example, it would not be possible to form the elements A and P (encompassed within the ranges of FIGS. 11(A) and 11(B), respectively) accurately on the substrate while also accurately forming the element B (encompassed within the range of FIG. 11(C)).

Now, according to this embodiment, modification ("local resizing") of pattern elements as defined on the reticle is performed while taking into account the differences in the magnitude of optical-system blur existing at different locations within a subfield.

Table 1 is an exemplary table of optical-system blur data for different locations in a subfield. The resolution of the data in the table (i.e., the range of locations for which the same blur value is given) may be adjusted as required. Also, blur data for locations not listed specifically in the table may be computed by interpolation between discrete data in the table. As an alternative to a table, if the distribution of blur within a subfield can be expressed as a function, then the function may be used to calculate local blur at any point in the subfield. (Use of a function would require less memory than using a table.)

TABLE 1

| Y-Position Within Subfield (μm) | X-Position Within Subfield (μm) | | | | | | |
|---|---|---|---|---|---|---|---|
| | −125 | −120 | −115 | ... | 115 | 120 | 125 |
| −125 | 114.2 | 113.3 | 112.5 | ... | 112.5 | 113.3 | 114.2 |
| −120 | 113.3 | 112.4 | 111.6 | ... | 111.6 | 112.4 | 113.3 |
| −115 | 112.5 | 111.6 | 110.7 | ... | 110.7 | 111.6 | 112.5 |
| −110 | 111.6 | 110.7 | 109.8 | ... | 109.8 | 110.7 | 111.6 |
| −105 | 110.8 | 109.9 | 108.9 | ... | 108.9 | 109.9 | 110.8 |
| −100 | 110.0 | 109.1 | 108.1 | ... | 108.1 | 109.1 | 110.0 |
| . | . | . | . | . | . | . | . |
| . | . | . | . | . | . | . | . |
| . | . | . | . | . | . | . | . |
| 115 | 112.5 | 111.6 | 110.7 | ... | 110.7 | 111.6 | 112.5 |
| 120 | 113.3 | 112.4 | 111.6 | ... | 111.6 | 112.4 | 113.3 |
| 125 | 114.2 | 113.3 | 112.5 | ... | 112.5 | 113.3 | 114.2 |

Figure 12:
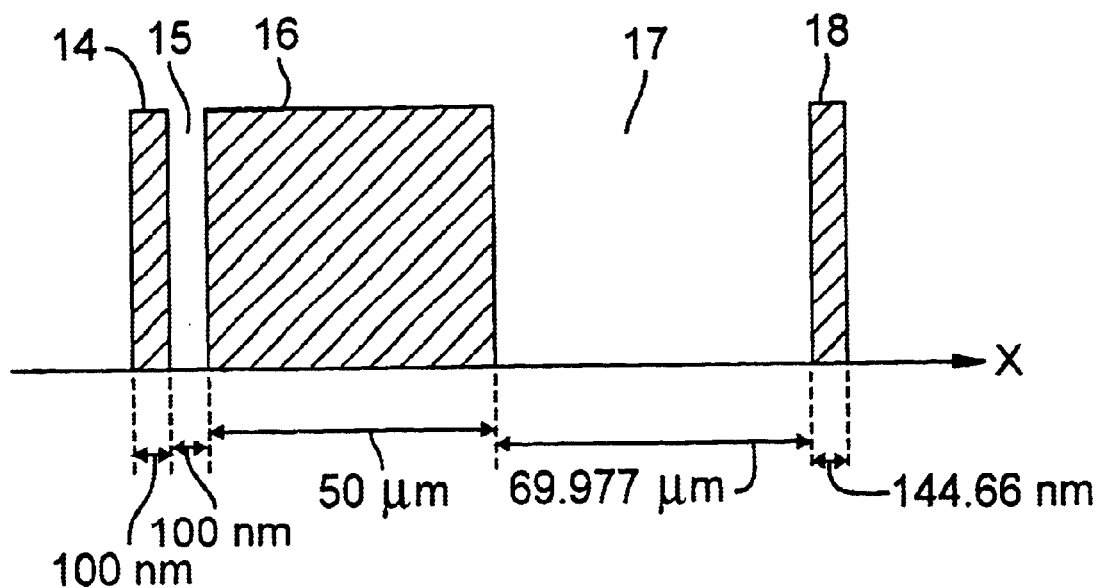
FIG. 12 shows a portion of a reticle in which certain pattern elements have been modified dimensionally using the proximity-effect correction method of the second representative embodiment.

FIG. 12 shows a portion of a reticle in which certain elements of the pattern portion have been modified dimensionally using the proximity-effect-correction method of this embodiment. The description is simplified by referring to the beam-energy profile immediately downstream of the reticle, and the depicted profile is at y=0. The pattern portion includes, from left to right in the figure, a narrow line element 14 that is 100 nm wide, a narrow space 15 that is 100 nm wide, a relatively wide line (pad) element 16 that is 50 μm wide, a relatively wide space 17 that is 69.977 μm wide, and a narrow line element 18 that is 144.66 nm wide 85.

Figure 13A:
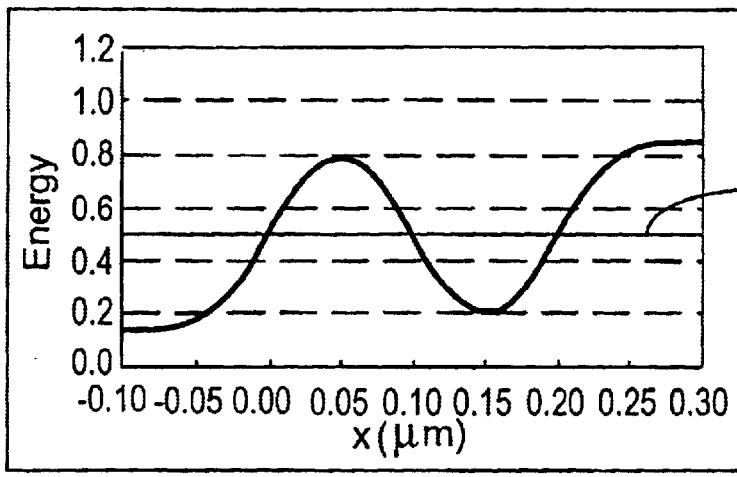
FIGS. 13(A)–13(C) depict respective regions of a plot of the distribution of cumulative exposure energy in the resist of a substrate, wherein profiles of pattern elements as defined on the reticle were modified according to the second representative embodiment, using the data in Table 1 to correct for proximity effects.
Figure 13B:
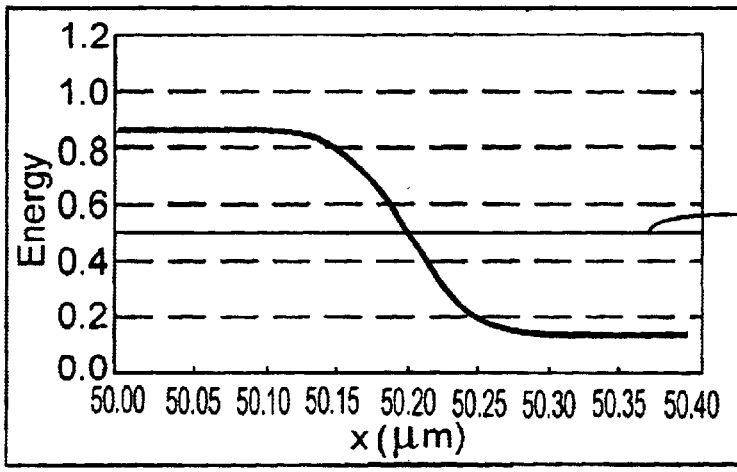
Figure 13C:
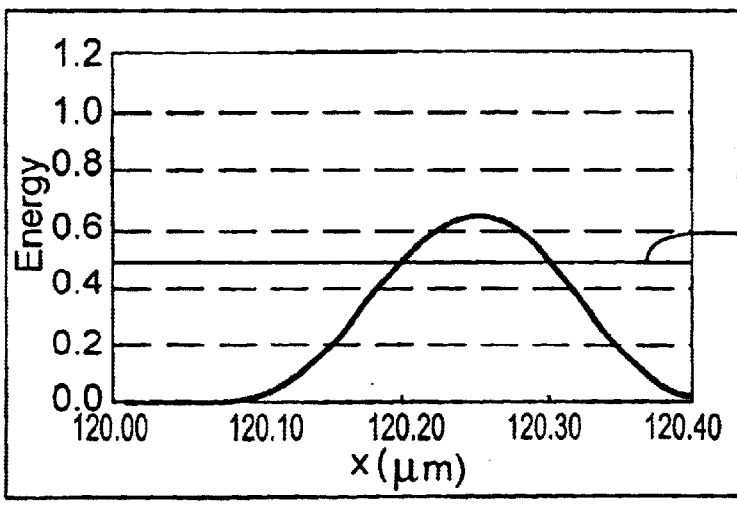

FIGS. 13(A)–13(C) depict respective regions of a plot of the cumulative exposure energy (data normalized as described above) in the layer of resist on the sensitive substrate, wherein profiles of pattern elements (as defined on the reticle) were modified, according to this embodiment and using Table 1, to correct for proximity effects.

Each of FIGS. 13(A)–13(C) provides a different portion of the plot along the abscissa (as in FIGS. 5(A)–5(C)):

FIG. 13(A): from x=−0.1 μm to x=0.3 μm

FIG. 13(B): from x=50.0 μm to x=50.4 μm

FIG. 13(C): from x=120.0 μm to x=120.4 μm

In FIGS. 13(A)–13(C), each of the respective thresholds 80, 81, 82 as indicated has been established so that the boundaries of pattern elements formed in the respective regions of the subfield will be coincident with the corresponding pattern boundaries as designed. Also, local resizing of the pattern elements is performed taking into account the non-uniformity of blur within the subfield. Unlike the situations shown in FIGS. 5(A)–5(C) and FIGS. 11(A)–11(C), slicing all the energy profiles shown in FIGS. 13(A)–13(C) at the same threshold (0.5 in this instance), pattern elements are formed at any location in the subfield having exactly the desired respective dimensions and profiles.

Third Representative Embodiment

In the second representative embodiment described above, the optical-system blur was calculated based on an isotropic Gaussian distribution of blur (isotropic with respect to distance from any desired point). This embodiment is directed to a situation in which the distribution of blur is anisotropic, in which the different equations are used in the energy-distribution calculations. The following equation (Equation (12)) provides better correction under anisotropic conditions than obtained under isotropic conditions of blur. For example, at a given point (x, y) in the subfield, the blur distribution in a direction parallel to the X-axis is expressed generally as $\beta_x(x,y)$, and the blur distribution in a direction parallel to the Y-axis is expressed generally as $\beta_y(x,y)$.

Figure 14:
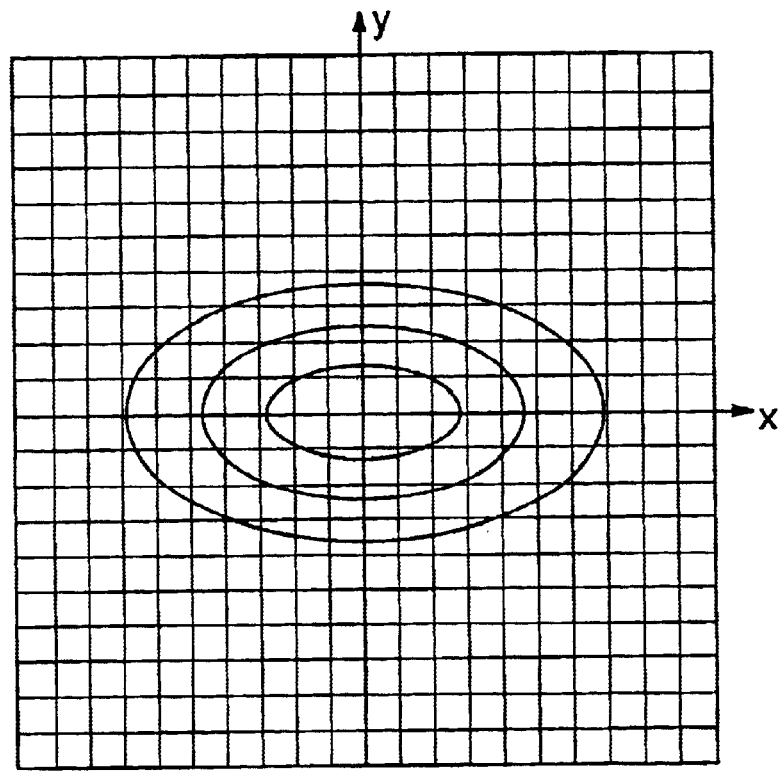
FIG. 14 is an X-Y plot of an exemplary elliptical distribution of blur, as referred to in the third representative embodiment, corrected using Equation (12).
Figure 15:
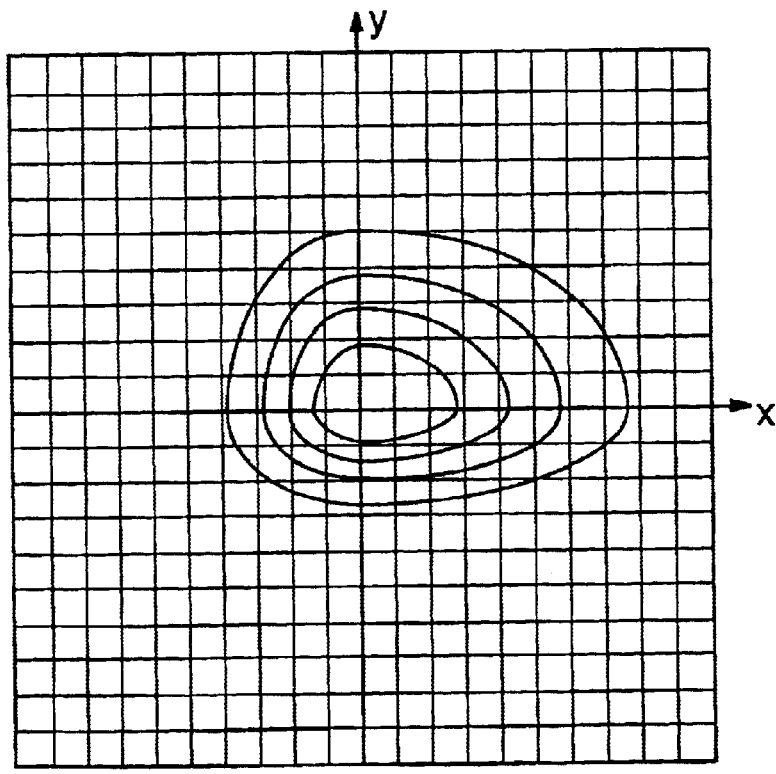
FIG. 15 is an X-Y plot of an exemplary complex distribution of blur, as referred to in the third representative embodiment, corrected using Equation (13).

According to this embodiment, Table 2, below, is referred to for suitable exemplary values of $\beta_x(x,y)$, and Table 3 is referred to for suitable values of $\beta_y(x,y)$. Also, the following equation is used in lieu of Equation (1) for making corrections for elliptical distributions of blur (e.g. as shown in FIG. 14). The integration range is −∞ to +∞.

$$DW(x, y) = \frac{1}{\pi \beta_x \beta_y} \int \int \exp\left[-\frac{(x-x')^2}{\beta_x^2} - \frac{(y-y')^2}{\beta_y^2}\right] DR(x', y') dx' dy' \quad (12)$$

TABLE 2

| Y-Position Within Subfield (μm) | X-Position Within Subfield (μm) | | | | | | |
|---|---|---|---|---|---|---|---|
| | −125 | −120 | −115 | ... | 115 | 120 | 125 |
| −125 | 108.3 | 107.8 | 107.3 | ... | 107.3 | 107.8 | 108.3 |
| −120 | 107.3 | 106.7 | 106.2 | ... | 106.2 | 106.7 | 107.3 |
| −115 | 106.3 | 105.7 | 105.2 | ... | 105.2 | 105.7 | 106.3 |
| −110 | 105.3 | 104.7 | 104.2 | ... | 104.2 | 104.7 | 105.3 |
| −105 | 104.3 | 103.8 | 103.2 | ... | 103.2 | 103.8 | 104.3 |
| −100 | 103.4 | 102.8 | 102.2 | ... | 102.2 | 102.8 | 103.4 |
| . | . | . | . | . | . | . | . |
| . | . | . | . | . | . | . | . |
| . | . | . | . | . | . | . | . |

TABLE 2-continued

| Y-Position Within Subfield (μm) | X-Position Within Subfield (μm) | | | | | | |
|---|---|---|---|---|---|---|---|
| | −125 | −120 | −115 | ... | 115 | 120 | 125 |
| 115 | 106.3 | 105.7 | 105.2 | ... | 105.2 | 105.7 | 106.3 |
| 120 | 107.3 | 106.7 | 106.2 | ... | 106.2 | 106.7 | 107.3 |
| 125 | 108.3 | 107.8 | 107.3 | ... | 107.3 | 107.8 | 108.3 |

TABLE 3

| Y-Position Within Subfield (μm) | X-Position Within Subfield (μm) | | | | | | |
|---|---|---|---|---|---|---|---|
| | −125 | −120 | −115 | ... | 115 | 120 | 125 |
| −125 | 106.1 | 105.7 | 105.4 | ... | 105.4 | 105.7 | 106.1 |
| −120 | 105.0 | 104.6 | 104.3 | ... | 104.3 | 104.6 | 105.0 |
| −115 | 103.9 | 103.6 | 103.2 | ... | 103.2 | 103.6 | 103.9 |
| −110 | 102.9 | 102.5 | 102.1 | ... | 102.1 | 102.5 | 102.9 |
| −105 | 101.9 | 101.4 | 101.1 | ... | 101.1 | 101.4 | 101.9 |
| −100 | 100.8 | 100.4 | 100.0 | ... | 100.0 | 100.4 | 100.8 |
| . | . | . | . | . | . | . | . |
| . | . | . | . | . | . | . | . |
| 115 | 103.9 | 103.6 | 103.2 | ... | 103.2 | 103.6 | 103.9 |
| 120 | 105.0 | 104.6 | 104.3 | ... | 104.3 | 104.6 | 105.0 |
| 125 | 106.1 | 105.7 | 105.4 | ... | 105.4 | 105.7 | 106.1 |

If the blur at points, located in the +X and −X directions from an ideal point of incidence of the beam on the wafer, are $\beta_{x1}(x,y)$ and $\beta_{x2}(x,y)$, respectively, and the blur at points, located in the +Y and −Y directions from the ideal point are $\beta_{y1}(x,y)$ and $\beta_{y2}(x,y)$, respectively, then the following equation can be used in lieu of Equation (1) to calculate the exposure-energy distribution DW(x,y) at the upstream-facing surface of the substrate. The indicated integration ranges are in the general range of −∞ to +∞. This allows the effects of a complex blur distribution, such as shown in FIG. 5, to be accounted for.

$$DW(x, y) = \left(\frac{2\beta_{x1}}{\beta_{x1}+\beta_{x2}}\right)\left(\frac{2\beta_{y1}}{\beta_{y1}+\beta_{y2}}\right)\left(\frac{1}{\pi\beta_{x1}+\beta_{y1}}\right) \quad (14)$$

$$\int_{x<x'}\int_{y<y'} \exp\left[\frac{-(x-x')^2}{\beta_{x1}^2} - \frac{(y-y')^2}{\beta_{y1}^2}\right] DR(x', y')dx'dy' +$$

$$\left(\frac{2\beta_{x2}}{\beta_{x1}+\beta_{x2}}\right)\left(\frac{2\beta_{y1}}{\beta_{y1}+\beta_{y2}}\right)\left(\frac{1}{\pi\beta_{x2}+\beta_{y1}}\right)$$

$$\int_{x\geq x'}\int_{y<y'} \exp\left[\frac{-(x-x')^2}{\beta_{x2}^2} - \frac{(y-y')^2}{\beta_{y1}^2}\right] DR(x', y')dx'dy' +$$

$$\left(\frac{2\beta_{x2}}{\beta_{x1}+\beta_{x2}}\right)\left(\frac{2\beta_{y1}}{\beta_{y1}+\beta_{y2}}\right)\left(\frac{1}{\pi\beta_{x2}+\beta_{y2}}\right)$$

$$\int_{x\geq x'}\int_{y\geq y'} \exp\left[\frac{-(x-x')^2}{\beta_{x2}^2} - \frac{(y-y')^2}{\beta_{y2}^2}\right] DR(x', y')dx'dy' +$$

$$\left(\frac{2\beta_{x1}}{\beta_{x1}+\beta_{x2}}\right)\left(\frac{2\beta_{y2}}{\beta_{y1}+\beta_{y2}}\right)\left(\frac{1}{\pi\beta_{x1}+\beta_{y2}}\right)$$

$$\int_{x<x'}\int_{y\geq y'} \exp\left[\frac{-(x-x')^2}{\beta_{x1}^2} - \frac{(y-y')^2}{\beta_{y2}^2}\right] DR(x', y')dx'dy'$$

For the calculations, tables similar to Tables 1, 2, and 3 are prepared in advance for values of $\beta_{x1}(x,y)$, $\beta_{x2}(x,y)$, $\beta_{y1}(x,y)$, and $\beta_{y2}(x,y)$.

Fourth Representative Embodiment

In this embodiment modification of the respective shapes of pattern elements as defined on the reticle is performed by accessing a table of optical-system blur data that vary with changes in location within an individual subfield.

Reference is made to Table 4 listing exemplary values of optical-system blur (nm) versus X-Y location (μm) within the subfield. In Table 4, blur data is listed per 5-μm increments in position. The level of resolution can be changed readily as conditions warrant. Alternatively to using Table 4, if the distribution of blur within a subfield can be expressed as a function, the function may used to determine blur. In the present instance, the blur data were calculated using Equation (8).

TABLE 4

| Y-Position Within Subfield (μm) | X-Position Within Subfield (μm) | | | | | | |
|---|---|---|---|---|---|---|---|
| | −125 | −120 | −115 | ... | 115 | 120 | 125 |
| −125 | 94.2 | 93.3 | 92.5 | ... | 92.5 | 93.3 | 94.2 |
| −120 | 93.3 | 92.4 | 91.6 | ... | 91.6 | 92.4 | 93.3 |
| −115 | 92.5 | 91.6 | 90.7 | ... | 90.7 | 91.6 | 92.5 |
| −110 | 91.6 | 90.7 | 89.8 | ... | 89.8 | 90.7 | 91.6 |
| −105 | 90.8 | 89.9 | 88.9 | ... | 88.9 | 89.9 | 90.8 |
| −100 | 90.0 | 89.1 | 88.1 | ... | 88.1 | 89.1 | 90.0 |
| . | . | . | . . | . | . | . | . |
| . | . | . | . . | . | . | . | . |
| . | . | . | . . | . | . | . | . |
| 115 | 92.5 | 91.6 | 90.7 | ... | 90.7 | 91.6 | 92.5 |
| 120 | 93.3 | 92.4 | 91.6 | ... | 91.6 | 92.4 | 93.3 |
| 125 | 94.2 | 93.3 | 92.5 | ... | 92.5 | 93.3 | 94.2 |

Figure 16:
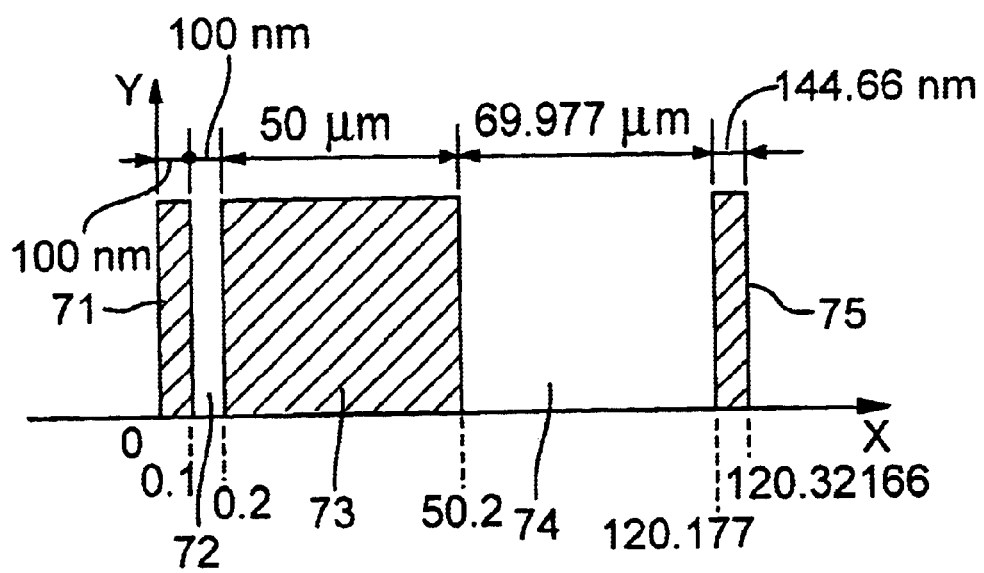
FIG. 16 shows a portion of a reticle in which certain pattern elements have been modified dimensionally using the proximity-effect correction method of the fourth representative embodiment, using the data in Table 4.

FIG. 16 shows a portion of a reticle in which certain elements of the pattern have been modified dimensionally according to the proximity-effect-correction method of this embodiment. The description is simplified by referring to the energy profile immediately downstream of the reticle. The pattern portion includes, from left to right in the figure, a narrow line element 71, a narrow space 72, a relatively wide line (pad) 73, a relatively wide space 74, and a narrow line element 75. The individual width of the line element 71 and of the space 72 is 100 nm, and the width of the pad element 73 is 50 μm. The space 74 is 69.977 μm wide, and the line element 75 is 144.66 nm wide.

Figure 17A:
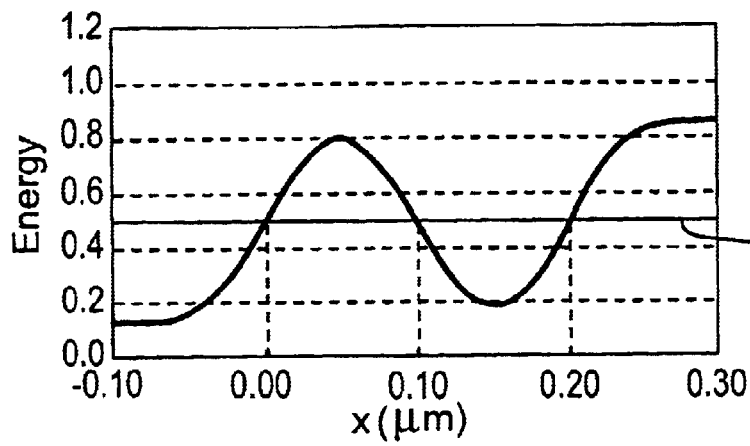
FIGS. 17(A)–17(C) depict respective regions of a plot of the distribution of cumulative exposure energy in a layer of resist on a substrate exposed with the pattern portion shown in FIG. 16.
Figure 17B:
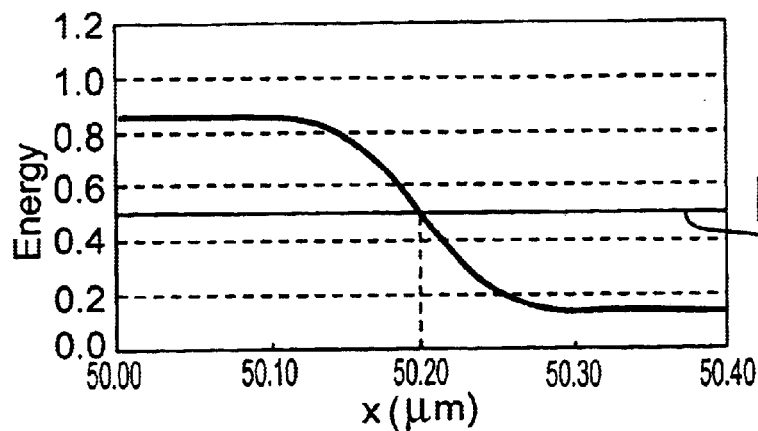
Figure 17C:
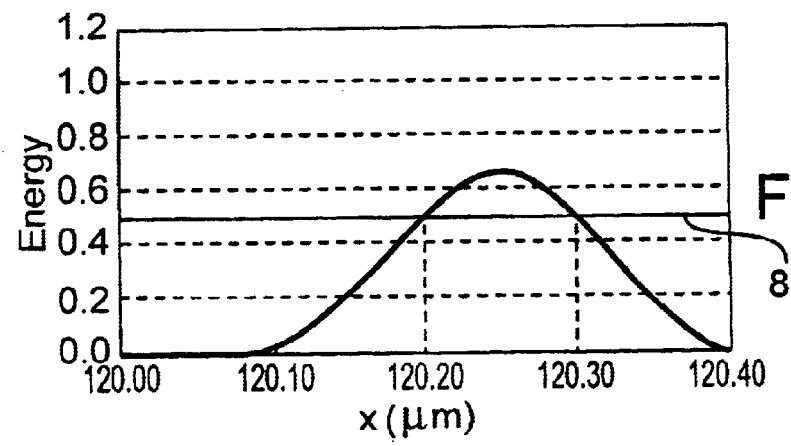

FIGS. 17(A)–17(C) collectively constitute a representative plot of cumulative exposure energy obtained using the reticle portion shown in FIG. 16. FIGS. 17(A)–17(C) show the energy profile over the same three respective ranges of x as in FIGS. 8(A)–8(C):

FIG. 17(A): from x=−0.1 μm to x=0.3 μm

FIG. 17(B): from x=50.0 μm to x=50.4 μm

FIG. 17(C): from x=120.0 μm to x=120.4 μm

The horizontal lines 86, 87, 88 in FIGS. 17(A)–17(C), respectively, denote exposure-threshold values that result in edges of pattern elements being formed at their respective prescribed locations. Unlike the situation depicted in FIGS. 9(A)–9(C), in this embodiment, the respective elements in the pattern portions as defined on the reticle have been adjusted dimensionally to correct for the non-uniformity of blur occurring within the subfield. Hence, whenever the energy profile is "sliced" at the prescribed threshold of 0.5, for example, the respective pad and line elements formed on the sensitive substrate have the prescribed dimensions as shown in FIG. 7(A).

Fifth Representative Embodiment

This embodiment is directed to a method in which the degree of correction to be made to pattern elements as defined on the reticle is determined from the dose level and slope of the corresponding beam-energy distribution at the reticle. The correction is made by changing the respective positions of the edges of pattern elements as defined on the reticle and/or by adjusting the exposure dose. With an approximately 100 keV electron beam, for example, localized spreading of exposure in the resist due to backscatter is approximately 30 μm; forward-scattering is relatively small at about 7 μm. This degree of backscatter will produce a "fogging" effect, over the entire exposed pattern, that slowly changes with increasing length of exposure time. The effect of forward-scattering, however, is comparatively small, usually several tens of nm of blur maximum; hence, forward-scattering either can be ignored or included in determining blur.

Figure 18:
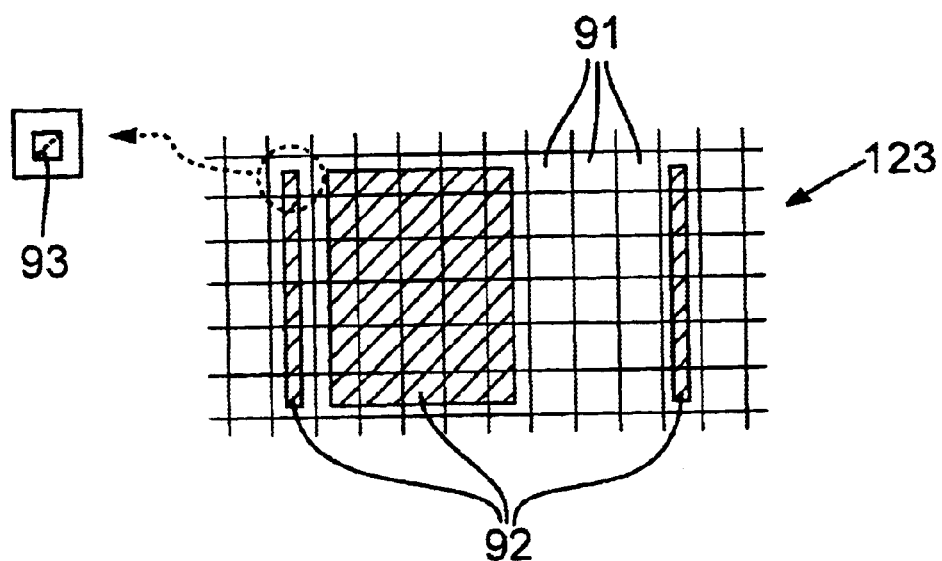
FIG. 18 shows a typical plan view of a patterned region in the resist layer on a substrate, wherein the depicted region is divided by grid lines as described in the fifth representative embodiment.

According to this embodiment, fogging due to backscattering is calculated for the respective positions of the edges of a specific pattern element. FIG. 18 shows a typical plan view of a patterned region on the sensitive substrate 123, wherein the depicted region is divided by grid lines into sub-regions 91. The depicted region includes a pad-like pattern element 92. Each sub-region 91 containing a respective portion of the element 92 is represented by a "representative figure" 93. With respect to a particular sub-region 91, the area of the respective representative FIG. 93 is the same as the area of the respective portion of the element 92 in the sub-region 91. Fogging (that otherwise would affect the locations of the pattern-element edges) due to backscattering in the representative figures 93 in each of the respective sub-regions 91 is calculated. The fogging for the entire area of the pattern element 92 can be calculated by summing the results obtained from all the individual constituent sub-regions 91. In these calculations, because the effect of backscattering is somewhat large (approximately 30 μm), sufficiently accurate calculations can be obtained by establishing the side dimension of each sub-region at about 1 to 3 μm. A representative total area used in the calculation can be, for example, 100 μm.

Figure 19:
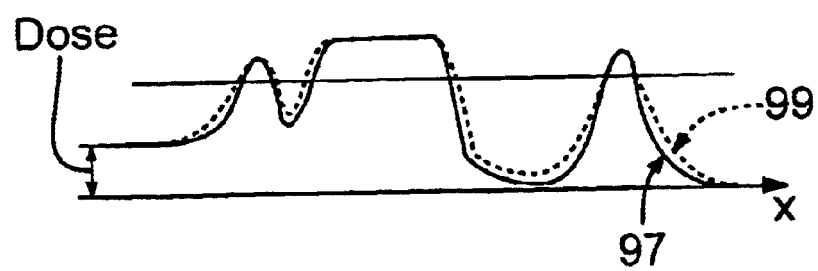
FIG. 19 is a plot of an exemplary distribution of exposure dose at the substrate as obtained by projection-exposing the elements shown in FIG. 18.

Next, the dose (exposure-energy) distribution over the edges of the pattern elements is found. FIG. 19 shows an exemplary dose distribution at the substrate for the elements shown in FIG. 18. In FIG. 19 the curve 97 represents an original dose distribution for the respective elements, not considering the influence of the blur imposed by other elements. The curve 99 represents the dose distribution for the respective elements, taking into consideration the influence of blur imposed by other elements. Note that the curve 99 is significantly different from the curve 97.

Although, in certain subfields, blur can be considered uniform, other subfields will exhibit significant variations in blur. Also, if the width of a pattern element is large compared to the blur, then the dose distribution including blur will have the same slope exhibited by the energy distribution of the beam itself (without blur being considered). On the other hand, if the pattern element is narrow compared to the blur, then the dose distribution including blur will be more gradual than the slope exhibited by the energy distribution of the beam itself (without blur being considered). The slope may be found by convolution of the blur with the pattern element. It is easier, however, to compute the slopes for a range of discrete linewidths, and saving them in a table to be accessed as required. The slope also can be determined using a simple equation, and blur can be added to the calculations as an extraneous parameter. Also whenever the magnitude of separation between adjacent elements of the pattern is approximately equal to the blur, the blur exhibited by one portion of the pattern element can affect the blur exhibited by another portion, thereby reducing the slope at the edges of the pattern element. The slopes of pattern-element edges can be determined from the blur of the beam, determined as described above, from the integral of the portion of the profile extending into the blur.

Thus, from the exposure dose as determined from backscatter, and from the calculated slope due to blur, the amount of correction (achieved by adjusting the position of the edge of the respective pattern element on the reticle or the magnitude of the dose) can be determined.

Sixth Representative Embodiment

Figure 20:
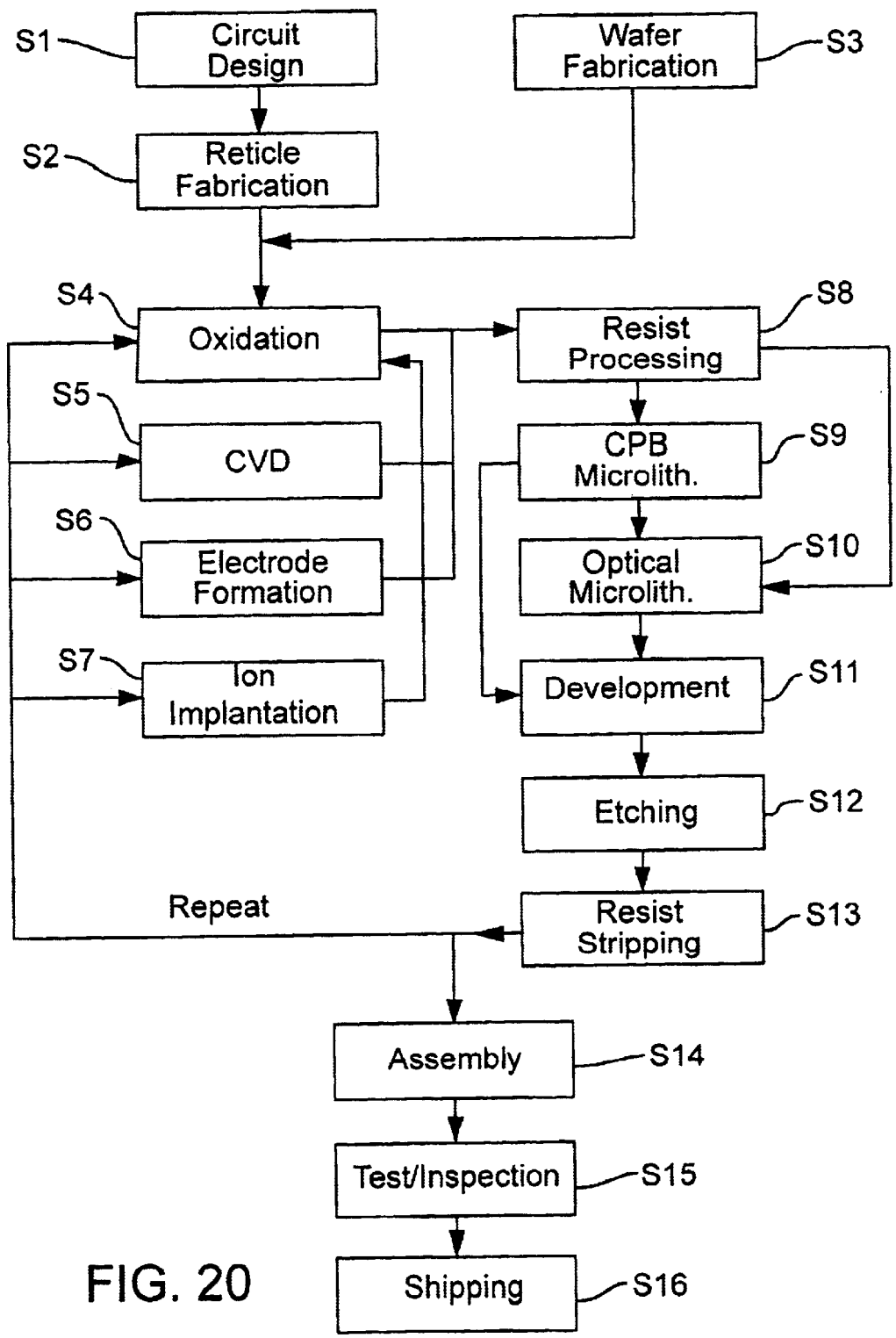
FIG. 20 is a flow chart of steps in a process for manufacturing a microelectronic device, as described in the sixth representative embodiment.

FIG. 20 is a flow chart of steps in a process for manufacturing a microelectronic device such as a semiconductor "chip" (e.g., an integrated circuit or LSI device), a display panel (e.g., liquid-crystal panel), CCD, or micromachine, for example. In step S1,, the circuit for the device is designed. In step S2, a reticle ("mask") for the circuit is manufactured. At this time, local resizing of pattern elements may be performed to correct for proximity effects and for beam blur due to space-charge effects. In step S3, a substrate ("wafer") is manufactured from a material such as silicon.

Steps S4–S13 are directed to wafer-processing steps, specifically "pre-process" steps. In the pre-process steps, the circuit pattern defined on the reticle is transferred onto the wafer by microlithography. Step S14 is an assembly step (also termed a "post-process" step) in which the wafer that has been passed through steps S4–S13 is formed into individual device chips. This step can include, for example, assembling the devices (dicing and bonding) and packaging (encapsulation of individual chips). Step S15 is an inspection and testing step in which any of various operability, qualification, and durability tests of the devices produced in step S14 are conducted. Afterward, devices that successfully pass step S15 are finished, packaged, and shipped (step S16).

Steps S4–S13 also provide representative details of wafer processing. Step S4 is an oxidation step for oxidizing the surface of the wafer. Step S5 involves chemical-vapor deposition (CVD) for forming an insulating film on the wafer surface. Step S6 is an electrode-forming step for forming electrodes on the wafer (typically by vapor deposition). Step S7 is an ion-implantation step for implanting ions (e.g., dopant ions) into the wafer or into a layer previously applied to the wafer. Step S8 involves application of a resist (exposure-sensitive material) to the wafer. Step S9 involves CPB microlithography (e.g., electron-beam microlithography) of the resist with the pattern defined on the reticle fabricated in step S2, to transfer a latent image of the pattern to the resist, as described elsewhere herein. In step S9, proximity-effect correction as disclosed elsewhere herein is performed. As an alternative to step S9, step S10 involves optical microlithography of the resist with the pattern defined on the reticle using an optical "stepper" or analogous device. Step S11 involves developing the exposed resist on the wafer. Step S12 involves etching the wafer to remove material from areas where developed resist is absent. Step S13 involves resist separation, in which remaining resist on the wafer is removed ("stripped") after the etching step. By repeating steps S4–S13, circuit patterns as defined by successive reticles are formed superposedly on the wafer.

Figure 21:
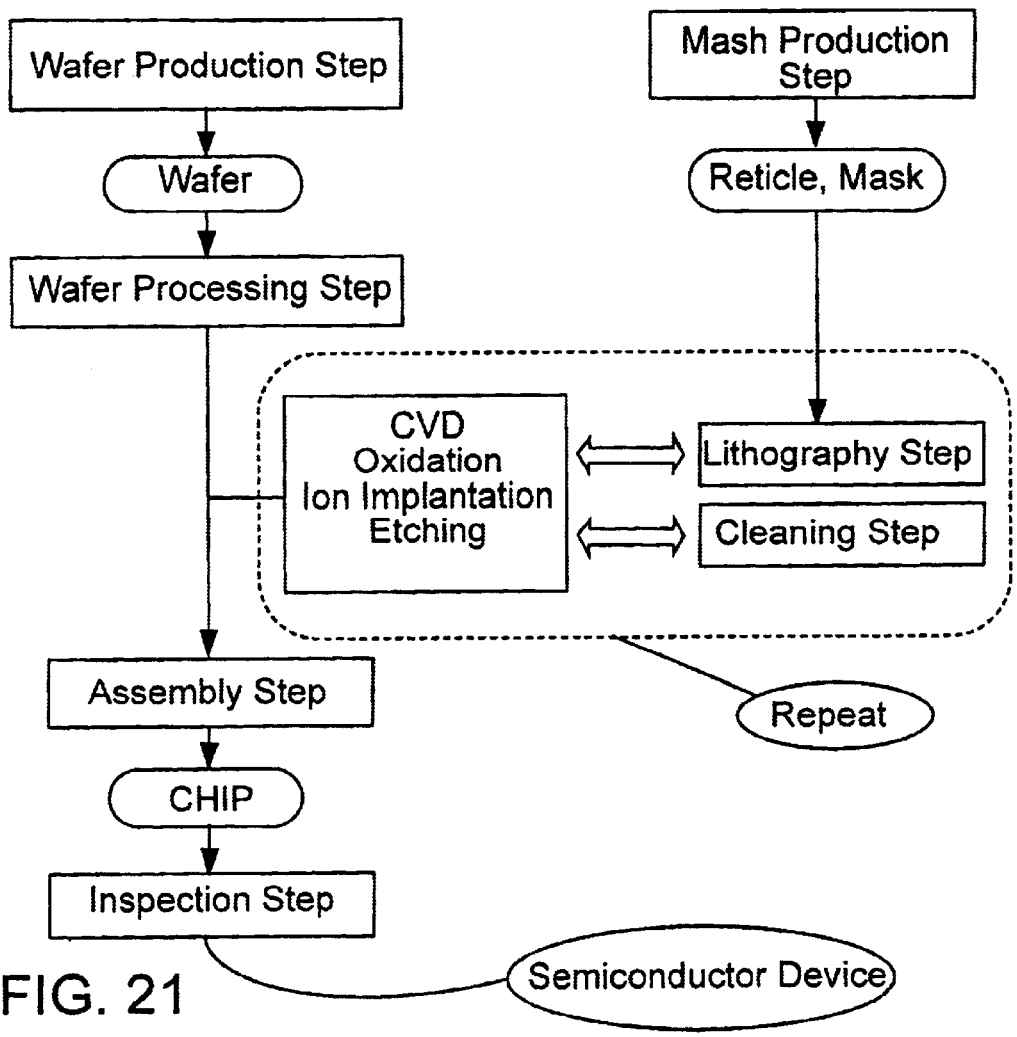
FIG. 21 is a flow chart of steps in a process for manufacturing a microelectronic device, as described in the sixth representative embodiment, wherein the process includes a microlithography method according to the invention.

FIG. 21 is another flow chart of an exemplary microelectronic-device fabrication method to which apparatus and methods according to the invention can be applied readily. The fabrication method generally comprises the main steps of wafer production (wafer preparation), wafer processing, device assembly, and device inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired microelectronic devices on the wafer.

Figure 22:
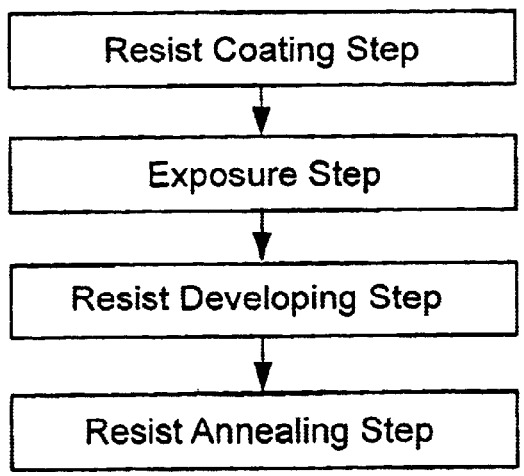
FIG. 22 is a flow chart for performing a microlithography method that includes a proximity-effect correction method according to the invention.
Figure 23:
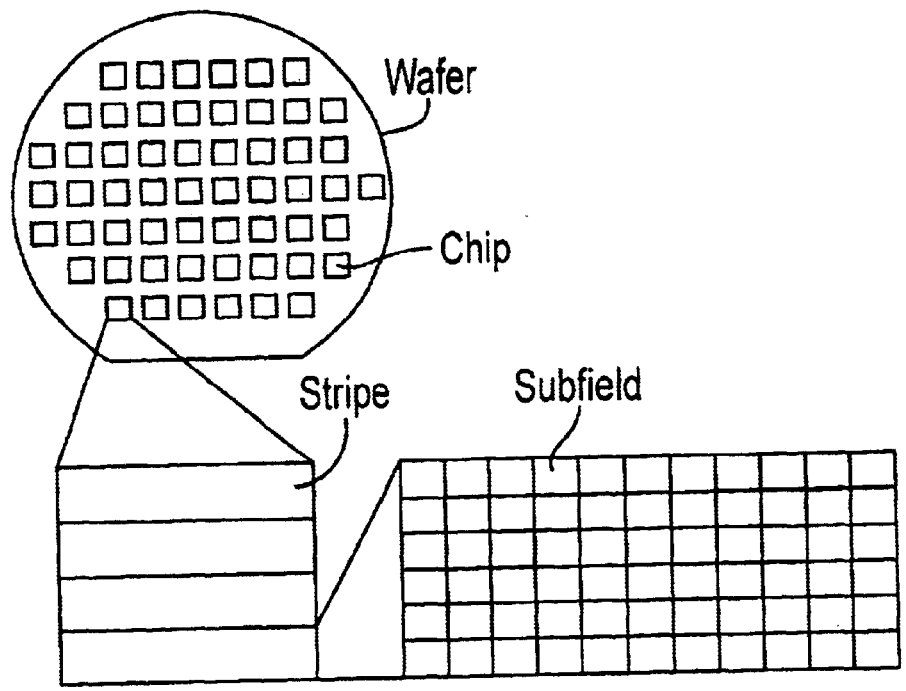
FIG. 23 schematically depicts certain aspects of a conventional divided-reticle microlithography performed using a charged particle beam.
Figure 24:
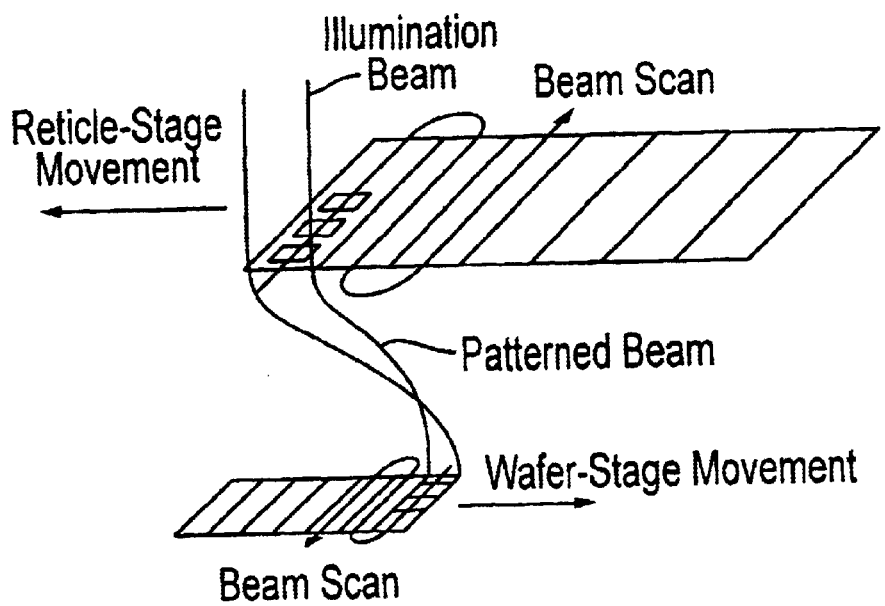
FIG. 24 schematically depicts an actual microlithographic exposure being made, according to conventional practice, using a divided reticle and a charged particle beam.

FIG. 22 provides a flow chart of typical steps performed in microlithography, which is a principal step in wafer processing. The microlithography step typically includes: (1) resist-application step, wherein a suitable resist is coated on the wafer substrate (which can include a circuit element formed in a previous wafer-processing step); (2) exposure step, to expose the resist with the desired pattern; (3) resist-development step, to develop the exposed resist to produce the imprinted image; and (4) optional resist-annealing step, to enhance the durability of the resist pattern.

The process steps summarized above are all well-known in the art.

Whereas the invention has been described in connection with multiple representative embodiments, it will be understood that the invention is not limited to those embodiments. On the contrary, the invention encompasses all modifications, alternatives, and equivalents as may be included within the spirit and scope of the invention, as defined by the appended claims.

What is claimed is:

1. In a method for making a transfer medium defining a pattern to be transferred lithographically to a sensitive substrate using a charged particle beam passing through a charged-particle-beam (CPB) optical system, a method for correcting proximity effects, comprising:

(a) dividing the pattern into multiple subfields to be exposed onto the substrate in respective shots of the charged particle beam, each subfield containing one or more respective elements of the pattern;

(b) for selected subfields, determining data concerning beam blur that would be imposed by the CPB optical system exposing the respective subfields, the blur for a selected subfield being a function of beam deflection to expose the subfield and of location of one or more pattern elements within the subfield;

(c) storing the data for the selected subfields; and (d) configuring the pattern on a reticle, wherein, for each of the selected subfields, the data is recalled and used in local resizing of the respective elements in the subfields so as to achieve a reduction of proximity effects in the subfield as transferred to the substrate.

2. The method of claim 1, wherein the data is stored as at least one respective table for each selected subfield.

3. The method of claim 1, wherein the data is stored as at least one respective equation for each selected subfield.

4. The method of claim 1, wherein the data is different for each of the selected subfields.

5. In a charged-particle-beam (CPB) microlithography method in which a pattern defined by a reticle is projection-exposed onto a resist-coated surface of a substrate using a charged particle beam as an energy beam, a method for correcting a proximity effect, resulting from backscattering of charged particles in the resist-coated substrate, by correcting pattern-element exposure data including data on radiation dose as well as respective profiles, edge positions, and dimensions of pattern elements, so as to adjust respective positions of edges of the pattern elements as defined on the reticle, the method comprising:

(a) determining blur of the charged particle beam irradiating the substrate, the blur being a function of beam deflection and respective locations of pattern elements within an area of the pattern exposed in a respective shot;

(b) from the determined blur, calculating preliminarily corrected pattern-element exposure data;

(c) at one or more edges of a pattern element as exposed onto the substrate, calculating exposure dose, as affected by backscattering, of the pattern element as defined by the preliminarily corrected pattern-exposure data;

(d) from the determined blur and calculated exposure dose, calculating a distribution of exposure dose in the vicinity of pattern-element edges as projected onto the substrate;

(e) from the calculated distribution of exposure dose, determining a dose threshold value;

(f) predicting, from the determined dose threshold value and the calculated distribution of exposure dose, positions of pattern-element edges that actually will be formed on the substrate; and (g) from the predicted positions of pattern-element edges, adjusting the pattern-element edge positions as defined on the reticle to cause the pattern-element edges as projected to be situated in respective prescribed locations on the substrate.

6. The method of claim 5, wherein step (g) the edge positions of pattern elements as projected onto the substrate are adjusted to the respective prescribed locations by making corresponding changes to pattern-element edge-position data in the pattern-element exposure data.

7. The method of claim 5, wherein in step (g) the edge positions of pattern elements as projected onto the substrate are adjusted to the respective prescribed locations by making corresponding changes to radiation-dose data in the pattern-element exposure data.

8. The method of claim 5, wherein step (c) comprises:

in a pattern region having a dimension substantially similar to a diameter of backscatter from an edge of the pattern element, defining a grid for dividing the pattern region into sub-regions containing respective portions of the pattern element, the sub-regions having dimensions that are from 1/100 to 1/3 the backscatter diameter;

within a sub-region, defining the pattern-element portion by a corresponding representative figure; and calculating the exposure dose, as affected by backscattering, based on the representative figure.

9. The method of claim 8, wherein:

determining blur includes determining a difference of blur from another location on the pattern from maximal blur for the pattern; and a correction is made, from doses contributed by proximity effects and slopes of edges of projected pattern elements, such that, at a prescribed dose threshold, the edges of the pattern elements are projected at their respective prescribed locations on the substrate.

10. The method of claim 9, wherein the slopes of edges of the projected pattern element having a width of no greater than four times the blur are obtained from a stored data table or from a stored equation in which blur is a function of linewidth of the pattern element as projected.

11. The method of claim 9, wherein blur has a value that is a function of magnitude of deflection of the charged particle beam incident to the substrate, or location within a transverse profile of the beam, or both.

12. The method of claim 5, wherein the charged particle beam incident to the substrate is an electron beam accelerated to at least 40 keV.

13. The method of claim 12, wherein the charged particle beam incident to the substrate is an electron beam accelerated to at least 50 keV.

14. The method of claim 13, wherein the charged particle beam incident to the substrate is an electron beam accelerated to at least 70 keV.

15. In a charged-particle-beam (CPB) microlithography method in which a pattern defined by a reticle is projection-exposed onto a resist-coated surface of a substrate using a charged particle beam, a method for correcting the reticle at time of reticle fabrication so as to correct proximity effects that otherwise would arise from backscattering of charged particles in the resist-coated substrate, by correcting pattern-exposure data including data on radiation dose and respective profiles and dimensions of pattern elements, so as to adjust respective positions of edges of the pattern elements as defined on the reticle, the method comprising:

(a) determining blur of the charged particle beam irradiating the substrate, the blur being a function of beam deflection and respective locations of pattern elements within an area of the pattern exposed in a respective shot;

(b) at one or more edges of a pattern element as exposed onto the substrate, calculating exposure dose, as affected by backscattering, of the pattern element;

(c) from the determined blur and the calculated exposure dose, calculating a distribution of exposure dose in the vicinity of pattern-element edges as projected onto the substrate;

(d) from the calculated distribution of exposure dose, determining a dose threshold value;

(e) predicting, from the determined dose threshold value and the calculated exposure dose, positions of pattern-element edges that actually will be formed on the substrate; and (f) from the predicted positions of pattern-element edges, adjusting the pattern-element edge locations to be defined on the reticle to cause the pattern-element edges as projected to be situated in respective prescribed locations on the substrate.

16. The method of claim 15, wherein locations of edges of pattern element as will be formed on the substrate by projection of the pattern on the reticle are adjusted to be at their prescribed locations on the substrate by changing corresponding pattern-element profile at dimensional data used for fabricating the reticle.

17. The method of claim 15, wherein locations of edges of pattern elements as will be formed on the substrate by projection of the pattern on the reticle are adjusted to be at their prescribed locations on the substrate by changing radiation-dose data corresponding to the pattern-element data as used for fabricating the reticle.

18. The method of claim 15, wherein step (b) comprises:

in a pattern region having a dimension substantially similar to a diameter of backscatter from an edge of the pattern element, defining a grid for dividing the pattern region into sub-regions containing respective portions of the pattern element, the sub-regions having dimensions that are from $1/100$ to $1/3$ the backscatter diameter;

within a sub-region, defining the pattern-element portion by a corresponding representative figure; and calculating the exposure dose, as affected by backscattering, based on the representative figure.

19. The method of claim 18, wherein:

determining blur includes determining a difference of blur from another location on the pattern from maximal blur for the pattern; and a correction is made, from doses contributed by proximity effects and slopes of edges of projected pattern elements, such that, at a prescribed dose threshold, the edges of the pattern elements are projected at their respective prescribed locations on the substrate.

20. The method of claim 19, wherein the slopes of edges of the projected pattern element having a width of no greater than four times the blur are obtained from a stored data table or from a stored equation in which blur is a function of linewidth of the pattern element as projected.

21. The method of claim 19, wherein blur has a value that is a function of magnitude of deflection of the charged particle beam incident to the substrate, or location within a transverse profile of the beam, or both.

22. The method of claim 15, wherein the charged particle beam incident to the substrate is an electron beam accelerated to at least 40 keV.

23. The method of claim 22, wherein the charged particle beam incident to the substrate is an electron beam accelerated to at least 50 keV.

24. The method of claim 23, wherein the charged particle beam incident to the substrate is an electron beam accelerated to at least 70 keV.

25. In a charged-particle-beam (CPB) microlithography method in which a pattern defined by a reticle is projection-exposed by a projection-optical system onto a resist-coated surface of a substrate using a charged particle beam as an energy beam, a method for correcting a proximity effect, resulting from backscattering of charged particles in the resist-coated substrate, by correcting pattern-exposure data including data on radiation dose and respective profiles and dimensions of pattern elements, so as to adjust respective positions of edges of the pattern elements as defined on the reticle, the method comprising:

(a) defining a design pattern to be formed on the resist-coated substrate;

(b) obtaining a primary reticle pattern by enlarging the design pattern by the reciprocal of a demagnification ratio of the projection-exposure system;

(c) calculating an energy profile $DW(x)$ of the charged particle beam that would exist at the resist-coated substrate after passage through the primary reticle pattern and through the projection-optical system, the calculation of $DW(x)$ taking into account a reduction of energy at the substrate due to blur of the charged particle beam during passage through the projection-optical system;

(d) calculating a profile $E(x)$ of cumulative exposure energy due to backscatter occurring at the resist-coasted substrate being irradiated by a charged particle beam having the energy profile $DW(x)$;

(e) for an energy profile that is a sum of $DW(x)$ and $E(x)$, setting a development-energy threshold for the pattern elements as projected from the primary reticle pattern;

(f) calculating widths of pattern elements that would be formed on the resist-coated substrate exposed with the charged particle beam from the primary reticle pattern; and (g) from the calculated widths of pattern elements, correcting the primary reticle pattern to form a for-projection pattern that will produce linewidths according to the design pattern, wherein corrections are made to individual pattern elements as defined on the reticle, taking into account the beam blur versus location of edges of the respective pattern elements within an area to be exposed in a single shot.

* * * * *